US 8,333,009 B2

(12) United States Patent
Hirata et al.

(10) Patent No.: US 8,333,009 B2
(45) Date of Patent: Dec. 18, 2012

(54) ALIGNING DEVICE AND BONDING APPARATUS

(75) Inventors: Atsuhiko Hirata, Yasu (JP); Shigeki Fukunaga, Higashiomi (JP); Shigeki Yamane, Konann (JP); Mitsuhiro Namura, Kusatsu (JP); Arata Suzuki, Yasu (JP); Tomonari Watanabe, Kusatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 1225 days.

(21) Appl. No.: 12/137,286

(22) Filed: Jun. 11, 2008

(65) Prior Publication Data

US 2008/0245472 A1    Oct. 9, 2008

Related U.S. Application Data

(63) Continuation of application No. PCT/JP2006/317467, filed on Sep. 4, 2006.

(30) Foreign Application Priority Data

Dec. 12, 2005  (JP) .................. 2005-357955

(51) Int. Cl.
*B23P 19/00* (2006.01)
(52) U.S. Cl. ............ 29/729; 29/739; 29/740; 29/741; 228/180.21; 228/180.22; 438/455
(58) Field of Classification Search ............ 29/739, 29/740, 741, 729; 228/180.21, 180.22; 438/455
See application file for complete search history.

(56) References Cited

U.S. PATENT DOCUMENTS 5,337,151 A * 8/1994 Baxter et al. .................. 356/401
2007/0232076 A1 * 10/2007 Hori et al. ...................... 438/758
2008/0245472 A1 * 10/2008 Hirata et al. ................... 156/264
2008/0245843 A1 * 10/2008 Suga et al. ..................... 228/3.1

FOREIGN PATENT DOCUMENTS

| JP | 10-258224 | 9/1998 |
| JP | 2003-57665 | 2/2003 |
| JP | 2003-322834 | 11/2003 |
| JP | 2004-151215 | 5/2004 |
| JP | 2004-151655 | 5/2004 |
| JP | 2004-309593 | 11/2004 |
| JP | 2005-77426 A | 3/2005 |
| WO | 2005071735 A1 | 8/2005 |

OTHER PUBLICATIONS

Official Communication issued in corresponding European Patent Application No. 06797390.9, mailed on Oct. 1, 2010.
International Search Report.
Written Opinion with English language translation.
Official Communication issued in corresponding Chinese Patent Application No. 2006800465939, issued on Sep. 11, 2009.

* cited by examiner

*Primary Examiner* — Carl Arbes
(74) *Attorney, Agent, or Firm* — Keating & Bennett, LLP

(57) ABSTRACT

An aligning device for electronic components and a bonding device using the aligning device. The aligning device includes a chamber, a flexible bellows within the chamber, two block used to hold an electronic component, a driving unit configured to move either of the two blocks relative to each other and located in an airtight chamber and an image port having a window through which one of the electronic components can be observed.

20 Claims, 13 Drawing Sheets

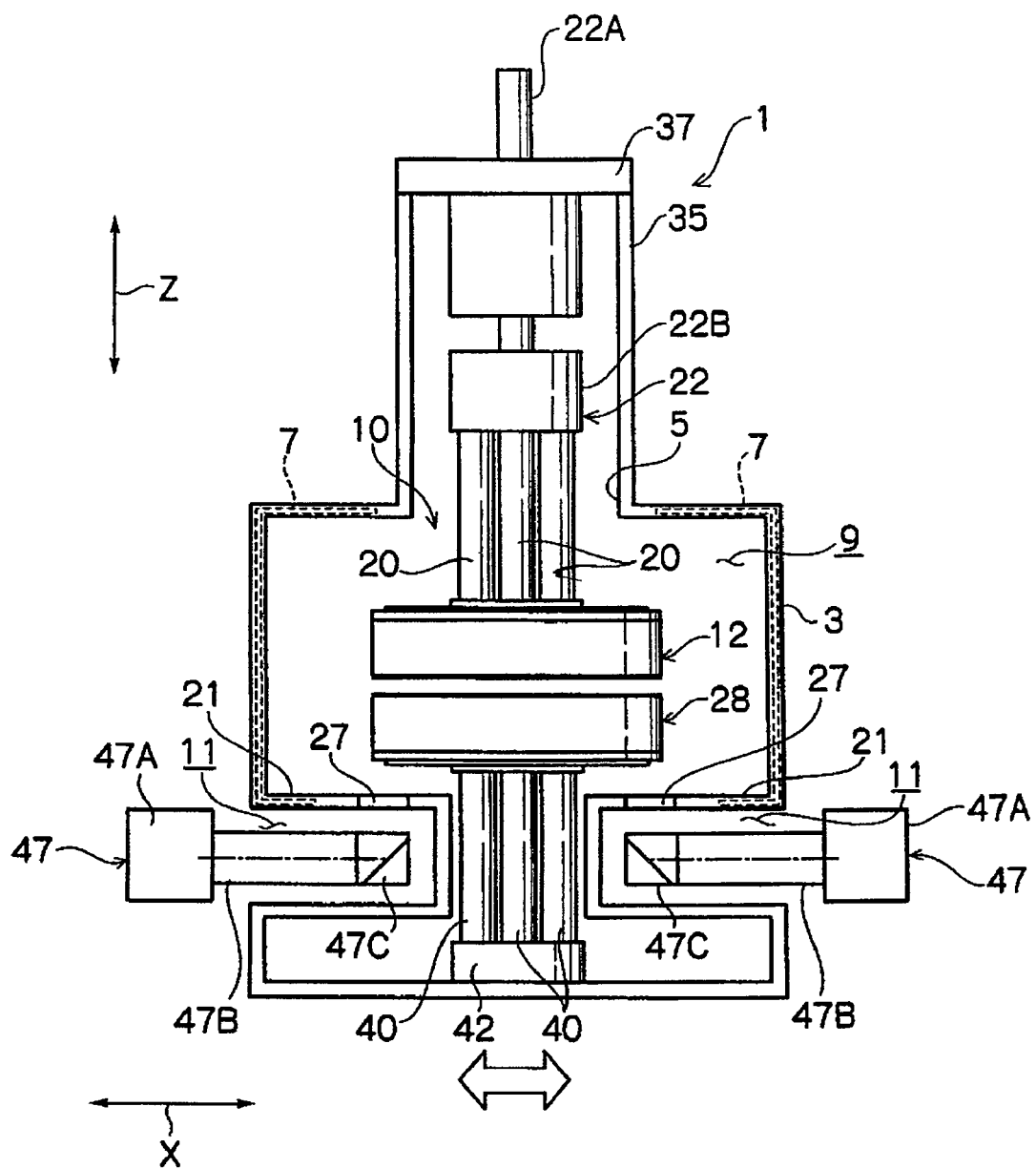

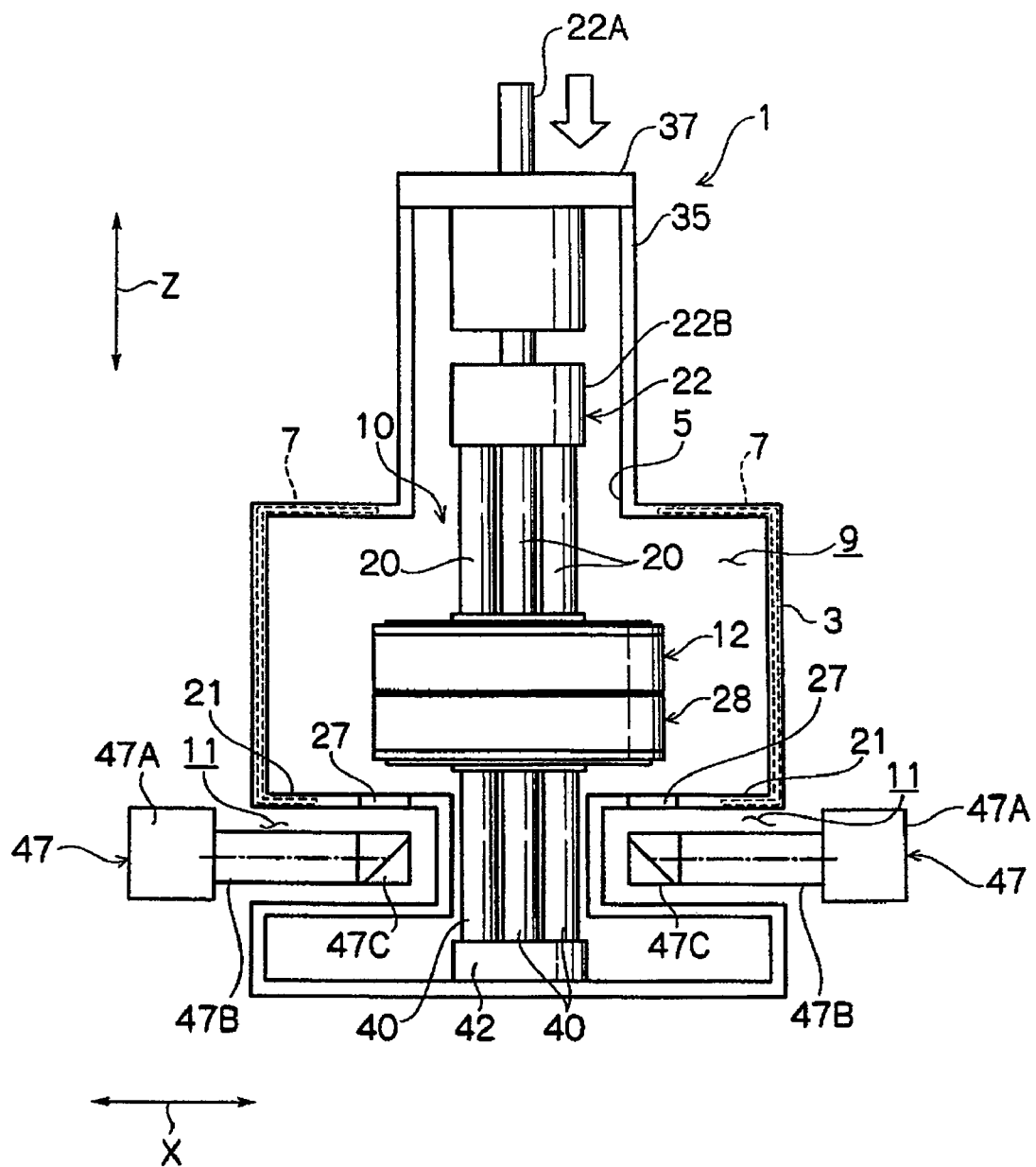

ALIGNING DEVICE AND BONDING APPARATUS

CROSS-REFERENCE TO RELATED APPLICATIONS

This is a continuation under 35 U.S.C. §111(a) of PCT/JP2006/317467 filed Sep. 4, 2006, and claims priority of JP2005-357955 filed Dec. 12, 2005, incorporated by reference.

BACKGROUND

1. Technical Field

The present disclosure relates to an aligning device for precisely aligning electronic components such as wafers, a bonding apparatus equipped with the aligning device, and an aligning method.

2. Background Art

In a known method for bonding liquid crystal substrates, an upper surface plate, on which an upper substrate having a positioning mark is held, and a lower surface plate, on which a lower substrate similarly having a positioning mark is held, with an elastic material disposed between the upper and lower surface plates, are stored to face each other in a vacuum chamber. The positions of the marks on the upper and lower substrates are recognized, and an absolute difference between the positions is recognized. When it is determined that the absolute difference between the mark positions is not a predetermined value, the lower substrate is moved by a linear driving unit with a correction amount corresponding to the amount of deformation of the elastic material (see the following Patent Document 1).

Further, a vacuum chamber including a movable unit, a fixed member, and a flexible and cylindrical member that is not air-permeable is known. The movable unit includes a sample stage on which a sample is placed, and a driving mechanism for driving the sample stage. The fixed member is provided with equipment for subjecting the sample to predetermined treatment. The cylindrical member is hermetically connected at one end to the fixed member, and is hermetically connected at the other end to the movable unit. The sample stage is placed in an evacuated space that is defined by the movable unit, the fixed member, and the cylindrical member. The driving mechanism is placed outside the space (see the following Patent Document 2).

Patent Document 1: Japanese Unexamined Patent Application Publication No. 2004-151215
Patent Document 2: Japanese Unexamined Patent Application Publication No. 10-258224

In the above-described Patent Document 1, cameras for finding the positioning marks provided on the upper and lower substrate are mounted below the lower substrate. Therefore, the distance in which the lower surface plate is movable to respond to misalignment is shortened (if the movable distance of the lower surface plate is increased, the lower surface plate comes into contact with recesses in which the cameras are mounted). Moreover, since the elastic material is provided between the lower surface plate and the upper surface plate, it is difficult to precisely recognize both marks.

Since the above-described Patent Document 2 is originally not intended to align and bond two electronic components, it does not disclose an optical system for alignment. If a camera is placed below the sample stage, problems similar to those in the above-described Patent Document 2 arise. Further, it is physically difficult to insert an optical system in a cutout provided in the flexible cylindrical member, because deformation of the cylindrical member imposes load on the optical system.

SUMMARY

Accordingly, in view of the above-described circumstances, it is desired to provide an aligning device that can reliably correct misalignment between electronic components and can increase the accuracy in aligning the electronic components, a bonding apparatus equipped with the aligning device, and an aligning method.

A first feature relates to an aligning device. The aligning device includes a chamber; a flexible bellows configured to define an airtight chamber therein with the chamber; a driving unit configured to move one of a first block member and a second block member relative to the other, the first block member holding a first electronic component and being provided in the airtight chamber, and the second block member holding a second electronic component and being provided in the airtight chamber; and an image-taking port protruding inward from an outer surface of the chamber so as to define a space, the image-taking port having an observation window through which at least one of the first electronic component and the second electronic component is observed.

In a second feature of the aligning device, an image-taking unit configured to take an image of at least one of the first electronic component and the second electronic component is provided in the space defined by the image-taking port.

In a third feature of the aligning device, the first electronic component has a first alignment mark, and the second electronic component has a second alignment mark. The aligning device further includes a control unit configured to calculate an amount of misalignment between images of the first alignment mark and the second alignment mark taken by the image-taking unit and to control the driving unit so as to correct the amount of misalignment.

In a fourth feature of the aligning device, one of the first block member and the second block member is translated relative to the other, and/or one of the first block member and the second block member is rotated relative to the other, by the control unit.

In a fifth feature of the aligning device, one of the first block member and the second block member is moved relative to the other by the driving unit in a direction such as to change a distance between the first electronic component held in the first block member and the second electronic component held in the second block member.

A sixth feature of the aligning device further includes a rotating seal portion configured to define the airtight chamber with the chamber and the bellows and to allow the bellows to corotate with the chamber.

In a seventh feature of the aligning device, the chamber includes a cooling-water channel through which cooling water flows.

An eighth feature relates to a bonding apparatus configured to bond electronic components, and includes the aligning device having at least one the first through seventh features.

In a ninth feature, the bonding apparatus includes the first block member; the second block member; a first pressure member provided so that a first space section is provided between the first pressure member and the first block member, and configured to press the first block member in a predetermined direction; a plurality of rod-shaped first flexible members provided in the first space section, connected to the other end face of the first block member such as to be equally spaced on a circumference concentric with the center of the first block member, and configured to transmit a pressure from the first pressure member to the first block member; a second pressure member provided so that a second space section is provided between the second pressure member and the second block member, and configured to press the second block member in a direction in which the second block member presses the first block member; a plurality of rod-shaped second flexible members provided in the second space section, connected to the other end face of the second block member such as to be equally spaced on a circumference concentric with the center of the second block member, and configured to transmit a pressure from the second pressure member to the second block member; and a heating member configured to heat the first block member and the second block member.

In a tenth feature, in the bonding apparatus, at least one of the first block member and the second block member includes a through portion extending through the first block member or the second block member in a thickness direction.

In an eleventh feature, in the bonding apparatus, an opening area of the through portion on one side in the thickness direction of the first block member or the second block member is larger than an opening area of the through portion on the other side in the thickness direction.

In a twelfth feature, in the bonding apparatus, the heating member is a heater chip, the first block member includes a first presser plate configured to hold the first electronic component, a first back plate connected to the first presser plate and having a coefficient of linear expansion equal or substantially equal to a coefficient of linear expansion of the first presser plate, and the heater chip connected to the first back plate so as to heat the first presser plate and having a coefficient of linear expansion equal or substantially equal to a coefficient of linear expansion of the first presser plate. The second block member includes a second presser plate configured to hold the second electronic component, a second back plate connected to the second presser plate and having a coefficient of linear expansion equal or substantially equal to a coefficient of linear expansion of the second presser plate, and the heater chip connected to the second back plate so as to heat the second presser plate and having a coefficient of linear expansion equal or substantially equal to a coefficient of linear expansion of the second presser plate.

In a thirteenth feature, in the bonding apparatus, the first presser plate and the second presser plate are formed of a conductive material, and the first back plate and the second back plate are formed of an insulating material.

In a fourteenth feature, in the bonding apparatus, a first cooling-gas channel through which cooling gas flows is provided between the first presser plate and the first back plate, and a second cooling-gas channel through which cooling gas flows is provided between the second presser plate and the second back plate.

In a fifteenth feature, in the bonding apparatus, the first flexible members have a cooling-gas supply function of passing the cooling gas therethrough and supplying the cooling gas to the first cooling-gas channel, and the second flexible members have a cooling-gas supply function of passing the cooling gas therethrough and supplying the cooling gas to the second cooling-gas channel.

A sixteenth feature, in the bonding apparatus, further includes a first drawing portion configured to draw the first electronic component onto the first presser plate, and a second drawing portion configured to draw the second electronic component onto the second presser plate.

In seventeenth feature, in the bonding apparatus, the first drawing portion includes a plurality of drawing grooves provided in the first presser plate, and a first hollow duct in which air introduced from the first drawing grooves flows. The second drawing portion includes a plurality of drawing grooves provided in the second presser plate, and a second hollow duct in which air introduced from the second drawing grooves flows.

In an eighteenth feature, in the bonding apparatus, the first hollow duct is connected to the first pressure member via a first elastic member, and the second hollow duct is connected to the second pressure member via a second elastic member.

In a nineteenth feature, in the bonding apparatus, a first cooling-gas supply channel in which the cooling gas to be supplied to the first flexible members flows and a first air channel in which air from the first hollow duct flows are provided in the first pressure member, and a second cooling-gas supply channel in which the cooling gas to be supplied to the second flexible members flows and a second air channel in which air from the second hollow duct flows are provided in the second pressure member.

In a twentieth feature, in the bonding apparatus, a first cooling-fluid circulation path in which cooling fluid for cooling the first pressure member circulates is provided in the first pressure member, and a second cooling-fluid circulation path in which cooling fluid for cooling the second pressure member circulates is provided in the second pressure member.

A twenty-first feature relates to an aligning method for an aligning device. The aligning device includes a chamber; a flexible bellows configured to define an airtight chamber therein with the chamber; a driving unit configured to move one of a first block member and a second block member relative to the other, the first block member holding a first electronic component having a first alignment mark and being provided in the airtight chamber, and the second block member holding a second electronic component having a second alignment mark and being provided in the airtight chamber; and an image-taking port protruding inward from an outer surface of the chamber so as to define a space, the image-taking port having an observation window through which at least one of the first electronic component and the second electronic component is observed. The aligning method includes a calculation step of calculating an amount of misalignment between images of the first alignment mark and the second alignment mark taken by an image-taking unit; and a correction step of correcting the amount of misalignment by moving one of the first block member and the second block member relative to the other.

According to the first feature, the image-taking unit is provided in the space defined by the image-taking port, an image of at least one of the first electronic component and the second electronic component provided in the airtight chamber is taken through the observation window, and one of the first block member and the second block member is moved relative to the other on the basis of the image taken by the image-taking unit. In this case, the first electronic component held in the first block member and the second electronic component held in the second block member can be moved relative to each other so as to align the first electronic component and the second electronic component.

Since the image-taking port protrudes inward from the outer surface of the chamber so as to define the space, even when the chamber moves together with the first block member and the second block member, the image-taking unit can be provided in the space so as to be prevented from interfering with the motion of the chamber. This allows the chamber to freely move without any restriction. As a result, one of the first block member and the second block member can be freely moved relative to the other without being restricted by the placement of the image-taking unit, and the first electronic component and the second electronic component can be aligned reliably.

According to the second feature, the image-taking unit for taking an image of at least one of the first electronic component and the second electronic component is provided near the image-taking port, and therefore, the image-taking unit is prevented from interfering with the movement of the chamber. This allows the chamber to be freely moved without any restriction. As a result, one of the first block member and the second block member can be freely moved relative to the other without being restricted by the placement of the image-taking unit, and the first electronic component and the second electronic component can be aligned reliably.

According to the third feature, the amount of misalignment between images of the first alignment mark on the first electronic component and the second alignment mark on the second electronic component taken by the image-taking unit is calculated by the control unit, and the driving unit is controlled so as to correct the amount of misalignment. This allows the first block member or the second block member to be moved so as to remove the misalignment between the first alignment mark on the first electronic component and the second alignment mark on the second block member. As a result, the accuracy in aligning the first electronic component and the second electronic component can be increased.

According to the fourth feature, one of the first block member and the second block member is translated relative to the other, and/or one of the first block member and the second block member is rotated relative to the other, by the driving unit. This greatly increases the accuracy in aligning the first electronic component and the second electronic component.

According to the fifth feature, for example, by moving one of the first block member and the second block member relative to the other by the driving unit in a direction in which the distance between the first electronic component held in the first block member and the second electronic component held in the second block member increases, the first electronic component and the second electronic component can be prevented from coming into contact with each other when one of the first block member and the second block member is moved relative to the other. This can prevent degradation, for example, due to a scratch or breakage of the first electronic component and the second electronic component.

On the other hand, by moving one of the first block member and the second block member relative to the other by the driving unit in the direction in which the distance between the first electronic component held in the first block member and the second electronic component held in the second block member increases, the first electronic component and the second electronic component can be brought closer to each other. This allows easy alignment of the first electronic component and the second electric component.

According to the sixth feature, since the rotating seal unit is provided to define the airtight chamber with the chamber and the bellows and to allow the bellows to corotate with the chamber, the bellows can corotate with the chamber while the airtight chamber is in an airtight state. This can prevent the bellows from being twisted during rotation of the chamber.

According to the seventh feature, since the cooling-water channel is provided in the chamber, even when the chamber is heated by transferred heat, it can be cooled by passing the cooling water through the cooling-water channel. This can prevent the equipment in the device from being damaged by an excessive temperature increase of the chamber.

According to the eighth feature, the bonding apparatus includes the aligning device having at least one of the first to seventh features. Therefore, the first electronic component and the second electronic component can be bonded together after being reliably aligned by the aligning device. This can increase the accuracy in bonding the first electronic component and the second electronic component.

According to the ninth feature, the first block member and the second block member are heated by the heating member in a state in which the first electronic component is held in the first block member and the second electronic component is held in the second block member. When the first block member and the second block member are heated, heat is transferred to the first electronic component and the second electronic component. Further, the first block member is pressed in a predetermined direction by the first pressure member. In this case, the pressure from the first pressure member is transmitted to the first block member by a plurality of rod-shaped first flexible members extending in the first space section between the first block member and the first pressure member. Similarly, the second block member is pressed in a predetermined direction by the second pressure member. In this case, the pressure from the second pressure member is transmitted to the second block member by a plurality of rod-shaped second flexible members extending in the second space section between the second block member and the second pressure member. The first block member and the second block member are pressed against each other by the action of the pressure. Consequently, the first electronic component and the second electronic component are pressed and bonded while being heated.

When the first block member and the second block member are heated, they thermally expand. However, since a heat insulator is not used, the first space section is provided between the first block member and the first pressure member, and the second space section is provided between the second block member and the second pressure member, most heat to be transferred from the first block member and the second block member to the first pressure member and the second pressure member is insulated by the first space section and the second space section. This can make the internal temperatures of the first block member and the second block member substantially uniform. When the first electronic component and the second electronic component are in contact with each other, the temperatures of the first block member, the second block member, the first electronic component, and the second electronic component can be substantially uniform as a whole. As a result, flatnesses of a surface of the first block member holding the first electronic component and a surface of the second block member holding the second electronic component can be maintained.

Even when the first block member and the second block member are heated, heat to be transferred from the first block member and the second block member to the first pressure member and the second pressure member is reduced because the first space section and the second space section are provided. Accordingly, portions heated by the heating member are substantially limited to the first block member, the second block member, the first electronic component, and the second electronic component. Therefore, the heat capacity of the heated portions is reduced, and the time needed to heat and cool the first electronic component and the second electronic component can be shortened. This can increase the availability ratio of the bonding apparatus.

Stress generated by the difference in thermal expansion between the first block member and the second block member, and the first pressure member and the second pressure member can be absorbed by bending the first flexible members and the second flexible members. In other words, since the first flexible members and the second flexible members are shaped like rods, the flexural rigidity thereof is relatively low, and the first flexible members and the second flexible members absorb the difference in the amount of thermal expansion by bending without warping the first block member and the second block member. As a result, flatnesses of the surface of the first block member holding the first electronic component and the surface of the second block member holding the second electronic component can be maintained.

In this case, since a plurality of first flexible members are equally spaced on the circumference concentric with the center of the first block member, the center of the first block member and the center of the first pressure member are not misaligned by bending of the first flexible members. Since a plurality of second flexible members are also equally spaced on the circumference concentric with the center of the second block member, the center of the second block member and the center of the second pressure member are not misaligned by bending of the second flexible members. Therefore, even when heating is performed, the first electronic component and the second electronic component are not misaligned, and stress is not applied thereto.

Further, since a plurality of first flexible members are equally spaced on the circumference concentric with the center of the first block member, the pressure is transmitted from the first pressure member to the first block member in a well-balanced manner. Since a plurality of second flexible members are equally spaced on the circumference concentric with the center of the second block member, the pressure is transmitted from the second pressure member to the second block member in a well-balanced manner. Therefore, the pressure applied to the first electronic component and the second electronic component is proper with little in-plane variation.

According to the tenth feature, at least one of the first block member and the second block member has a through portion extending through the first block member or the second block member in the thickness direction. Therefore, the image-taking unit for taking an image of the first electronic component or the second electronic component can be placed in the first space section or the second space section, and an image of the first electronic component or the second electronic component can be taken through the through portion. By appropriately moving the first block member or the second block member in accordance with the image taken by the image-taking unit, relative positioning of the first electronic component or the second electronic component can be performed easily. As a result, the accuracy in bonding the first electronic component and the second electronic component can be increased.

According to the eleventh feature, the opening area of the through portion on one side in the thickness direction of the first block member or the second block member is larger than the opening area of the through portion on the other side in the thickness direction. Therefore, when the image-taking unit for taking an image of the first electronic component or the second electronic component is placed in the first space section or the second space section, the optical path from the first electronic component or the second electronic component to the image-taking unit is not blocked by the first block member or the second block member. As a result, it is possible to increase the image-taking accuracy, and to increase the accuracy in bonding the first electronic component and the second electronic component.

According to the twelfth feature, the first block member includes the first presser plate configured to hold the first electronic component, the first back plate connected to the first presser plate and having a coefficient of linear expansion equal or substantially equal to a coefficient of linear expansion of the first presser plate, and the heater chip connected to the first back plate so as to heat the first presser plate and having a coefficient of linear expansion equal or substantially equal to a coefficient of linear expansion of the first presser plate. Therefore, the difference in the amount of thermal expansion between the first presser plate and the first back plate can be reduced. Consequently, warping of the first block member can be prevented, and the flatness of the first block member can be maintained.

Similarly, the second block member includes the second presser plate configured to hold the second electronic component, the second back plate connected to the second presser plate and having a coefficient of linear expansion equal or substantially equal to a coefficient of linear expansion of the second presser plate, and the heater chip connected to the second back plate so as to heat the second presser plate and having a coefficient of linear expansion equal or substantially equal to a coefficient of linear expansion of the second presser plate. Therefore, the difference in the amount of thermal expansion between the second presser plate and the second back plate can be reduced. Consequently, warping of the second block member can be prevented, and the flatness of the second block member can be maintained.

According to the thirteenth feature, since the first presser plate and the second presser plate are formed of a conductive material and the first back plate and the second back plate are formed of an insulating material, the first presser plate and the heater chip are electrically insulated from each other, and the second presser plate and the heater chip are also electrically insulated from each other. Accordingly, the first electronic component and the second electronic component can be bonded by anode coupling by applying a predetermined voltage to the first presser plate and the second presser plate in a state in which the first presser plate and the second presser plate are heated. As a result, variations can be added to the bonding method for the first electronic component and the second electronic component.

According to the fourteenth feature, since the first cooling-gas channel in which cooling gas flows is provided between the first presser plate and the first back plate, the first block member can be cooled at high speed by passing the cooling gas through the first cooling-gas channel. Further, since the second cooling-gas channel in which cooling gas flows is provided between the second presser plate and the second back plate, the second block member can be cooled at high speed by passing the cooling gas through the second cooling-gas channel. This can cool the first electronic component and the second electronic component at high speed, and can increase the availability ratio of the bonding apparatus.

According to the fifteenth feature, since the first flexible members have the cooling-gas supply function of passing the cooling gas therethrough and supplying the cooling gas to the first cooling-gas channel, they can be utilized as means for supplying the cooling gas to the first cooling-gas channel.

Similarly, since the second flexible members have the cooling-gas supply function of passing the cooling gas therethrough and supplying the cooling gas to the second cooling-gas channel, they can be utilized as means for supplying the cooling gas to the second cooling-gas channel.

According to the sixteenth feature, since the first presser plate has the first drawing portion for drawing the first electronic component on the first presser plate and the second presser plate has the second drawing portion for drawing the second electronic component on the second presser plate, the first electronic component can be easily and reliably held by the first presser plate, and the second electronic component can be easily and reliably held by the second presser plate. This can prevent the first electronic component from being misaligned with the first presser plate and can prevent the second electronic component from being misaligned with the second presser plate. Therefore, the accuracy in bonding the first electronic component and the second electronic component can be increased.

According to the seventeenth feature, since the first drawing portion includes a plurality of first drawing grooves provided in the first presser plate, and the first hollow duct in which air introduced from the first drawing grooves flows, air introduced from the first drawing grooves can flow in the first hollow duct. Consequently, the first electronic component can be reliably drawn by air suction force.

Similarly, since the second drawing portion includes a plurality of second drawing grooves provided in the second presser plate, and the second hollow duct in which air introduced from the second drawing grooves flows, air introduced from the second drawing grooves can flow in the second hollow duct. Consequently, the second electronic component can be reliably drawn by air suction force.

According to the eighteenth feature, since the first hollow duct is connected to the first pressure member via the first elastic member, when a difference in the amount of thermal deformation is formed between the first flexible members and the first hollow duct, stress to be transmitted from the first pressure member to the first block member via the first hollow duct can be absorbed by elastic deformation of the first elastic member. Consequently, it is possible to prevent stress from being transmitted from the first pressure member to the first block member via the first hollow duct, and to maintain the flatness of the first block member.

Similarly, since the second hollow duct is connected to the second pressure member via the second elastic member, when a difference in the amount of thermal deformation is formed between the second flexible members and the second hollow duct, stress to be transmitted from the second pressure member to the second block member via the second hollow duct can be absorbed by elastic deformation of the second elastic member. Consequently, it is possible to prevent stress from being transmitted from the second pressure member to the second block member via the second hollow duct, and to maintain the flatness of the second block member.

According to the nineteenth feature, the first cooling-gas supply channel in which cooling gas to be supplied to the first flexible members flows and the first air channel in which air from the first hollow duct flows are provided in the first pressure member. Therefore, the first pressure member can be utilized as a part of cooling-gas supply means or a part of air exhaust means.

Similarly, since the second cooling-gas supply channel in which cooling gas to be supplied to the second flexible members flows and the second air channel in which air from the second hollow duct flows are provided in the second pressure member. Therefore, the second pressure member can be utilized as a part of cooling-gas supply means or a part of air exhaust means. From the above, it is unnecessary to directly connect tubes to the first block member and the second block member that are heated to a high temperature, and cooling and vacuum drawing can be performed easily.

According to the twentieth feature, since the first cooling-fluid circulation path in which cooling fluid for cooling the first pressure member circulates is provided in the first pressure member, the first pressure member can be constantly cooled by circulating the cooling fluid in the first cooling-fluid circulation path. Since the first pressure member can be thereby kept at a lower temperature even during operation of the bonding apparatus, tubes for supplying cooling gas or cooling fluid to the first pressure member or exhausting air from the first pressure member can be easily connected without being restricted by the material.

Similarly, since the second cooling-fluid circulation path in which cooling fluid for cooling the second pressure member circulates is provided in the second pressure member, the second pressure member can be constantly cooled by circulating the cooling fluid in the second cooling-fluid circulation path. Since the second pressure member can be thereby kept at a lower temperature even during operation of the bonding apparatus, tubes for supplying cooling gas or cooling fluid to the second pressure member or exhausting air from the second pressure member can be easily connected without being restricted by the material.

In the method according to the twenty-first feature, the amount of misalignment between images of the first alignment mark and the second alignment mark taken by the image-taking unit is calculated in the calculation step. The amount of misalignment is corrected by moving one of the first block member and the second block member relative to the other in the correction step. Consequently, the first electronic component held in the first block member and the second electronic component held in the second block member can be precisely moved relative to each other so as to align the first electronic component and the second electronic component.

Since the image-taking port protrudes inward from the outer surface of the chamber so as to define the space, even when the chamber moves together with the first block member or the second block member, the image-taking unit can be placed in the space so as to prevent the image-taking unit from interfering with the motion of the chamber. This allows the chamber to freely move without any restriction. As a result, one of the first block member and the second block member can be freely moved relative to the other without being restricted by the placement of the image-taking unit, and the first electronic component and the second electronic component can be aligned reliably.

Other features and advantages will become apparent from the following description of embodiments, which refers to the accompanying drawings.

BRIEF DESCRIPTION OF DRAWINGS

FIG. 14 is a view showing one process in the modification of the aligning method using the aligning device according to the embodiment.

FIG. 15 is a view showing one process in the modification of the aligning method using the aligning device according to the embodiment.

DETAILED DESCRIPTION

Reference Numerals

Figure 1:
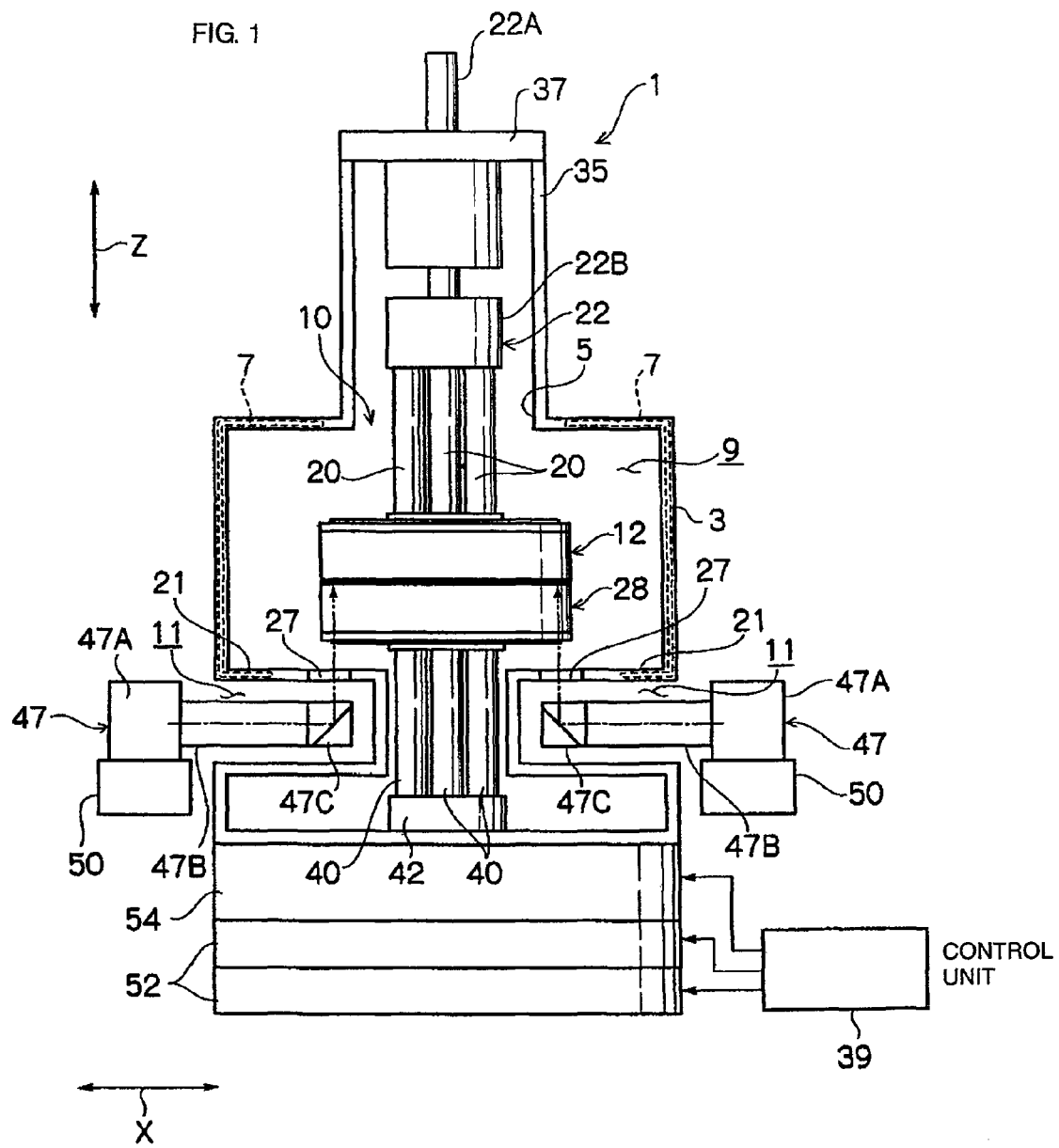
FIG. 1 is a schematic structural view of an aligning device according to an embodiment.

1: aligning device
3: chamber
7: cooling-water channel
9: airtight chamber
10: bonding apparatus
11: space
12: first block member
12A: first presser plate
12B: first back plate
12C: first heater chip (heating member, heater chip)
15: first cooling groove (first cooling-gas channel)
17: first drawing groove
19: first $N_2$-gas supply (first cooling-gas supply channel)
20: first column members (first flexible member)
21: image-taking port
22: first pressure shaft (first pressure member)
23: first air channel
24: first hollow member (first hollow duct)
25: first cooling-fluid circulation path
26: first O-ring (first elastic member)
27: observation window
28: second block member
28A: second presser plate
28B: second back plate
28C: second heater chip (heating member, heater chip)
31: second cooling groove (second cooling-gas channel)
33: second drawing groove
35: bellows
36: cutout (through portion)
37: magnetic seal unit (rotating seal unit)
39: control unit
40: second column member (second flexible member)
41: second $N_2$-gas supply channel (second cooling-gas supply channel)
42: second pressure shaft (second pressure member)
43: second air channel
44: second hollow member (second hollow duct)
45: second cooling-fluid circulation path
47: image recognizing device
52: XY table (driving unit)
54: rotating table (driving unit)
M1: first space section
M2: second space section
W1: first wafer (first electronic component)
W2: second wafer (second electronic component)

An aligning device will now be described with reference to the drawings. While the aligning device according to this embodiment aligns wafers as examples of electronic components, the present invention is not limited to alignment of wafers, and is also applicable to alignment of other electronic components.

As shown in FIG. 1, an aligning device 1 includes a chamber 3 that is hollow and substantially cubic. The chamber 3 is a rigid body, and a plurality of members are connected to the chamber 3 while being sealed by O-rings (not shown). A through hole 5 is provided in an upper wall of the chamber 3. In the upper, side, and bottom walls, a cooling-water channel 7 in which cooling water flows is provided. Cooling water can be supplied into the cooling-water channel 7 from the outside, and the cooling water supplied in the cooling-water channel 7 can be discharged outside. Accordingly, even when heat is transferred to the chamber 3 and the chamber 3 is thereby heated, it can be cooled by passing the cooling water through the cooling-water channel 7. As a result, it is possible to prevent the temperature of the chamber 3 from increasing excessively.

An image-taking port 21 protrudes inward from an outer surface of the side wall of the chamber 3 so as to define a space 11. The image-taking port 21 has an observation window 27 through which at least one of a first wafer W1 and a second wafer W2 that will be described below can be observed. In this embodiment, the image-taking port 21 and the space 11 are provided on each of the right and left sides of the chamber 3. Further, in this embodiment, the observation window 27 is formed by an observation glass.

A lower end of a flexible bellows 35 is connected to the rim of the through hole 5 provided in the upper wall of the chamber 3 so that an O-ring is disposed therebetween. An outer ring of a magnetic seal unit 37 is connected to an inner side of an upper end of the bellows 35 so that an O-ring is disposed therebetween. A shaft portion 22A of a first pressure shaft 22, which will be described below, is connected to an inner ring of the magnetic seal unit 37 in a manner such as to be sealed by an O-ring. This allows the bellows 35 to corotate with the chamber 3 in a state in which an airtight chamber 9 is placed in an airtight state, and the bellows 35 can be prevented from being twisted during rotation of the chamber 3.

The first pressure shaft 22 is driven in the Z-direction by a Z-axis driving mechanism, that is, a motor, reduction gears, and a ball screw. The motor is electrically connected to a control unit 39 that will be described below. By controlling the driving of the motor by the control unit 39, the movement of the first pressure shaft 22 in the Z-direction is controlled. Above the first pressure shaft 22, a load cell (not shown) is provided to measure the pressure generated between a first wafer W1 and a second wafer W2 that will be described below.

As described above, the chamber 3, the bellows 35, and the magnetic seal unit 37 are mutually and hermetically connected to one another, and the airtight chamber 9 kept in an airtight state is provided therein.

In each of the spaces 11 defined by the image-taking ports 21, an image recognizing device 47 is provided. The image recognizing device 47 includes a camera 47A, a lens 47B, and a prism 47C. The prism 47C of the image recognizing device 47 is provided directly below the observation window 27. This allows an image of a part of the below-described first and second wafers W1 and W2 placed in the airtight chamber 9 to be taken by the camera 47A through the observation window 27. The camera 47A is connected to a Z-axis camera actuator 50 so as to be movable in the Z-direction.

Below the bottom wall of the chamber 3, an XY stage 52 is provided so as to be driven in the XY-direction by a linear motor. On the XY stage 52, a rotating stage 54 to be rotated in the θ-direction is provided. The bottom wall of the chamber 3 is provided on the rotating stage 54. With this structure, the chamber 3 and a second block member 28, which will be described below, are translated in the XY-direction and rotated in the θ-direction. The control unit 39 is electrically connected to the linear motor, and the output of the linear motor is controlled by the control unit 39, so the driving of the XY stage 52 is controlled. The control unit 39 is electrically connected to the rotating stage 54, and the driving of the rotating stage 54 is controlled by the control unit 39.

The control unit 39 incorporates a CPU. The CPU calculates the amount of misalignment between the first wafer W1 and the second wafer W2 on the basis of image data from the camera 47A, and calculates the amount of correction for correcting (removing) the misalignment. On the basis of the calculated amount of correction, the driving of the XY stage 52, the rotating stage 54, and the first pressure shaft 22 is controlled by the control unit 39.

As described above, in this embodiment, a below-described second block member 28 is translated in the XY-direction and rotated in the θ-direction relative to the first block member 12 in the airtight chamber 9. The first block member 12 is moved in a direction such as to change the distance to the second block member 28 (Z-direction).

A bonding apparatus provided with the above-described aligning device 1 according to the embodiment of the present invention will now be described with reference to the drawings. While a bonding apparatus according to the embodiment bonds wafers as examples of electronic components, the present invention is not limited to bonding of wafers, and is also applicable to bonding of other electronic components. Since the configuration of the aligning device 1 has been described above, a description thereof will be omitted.

Figure 2:
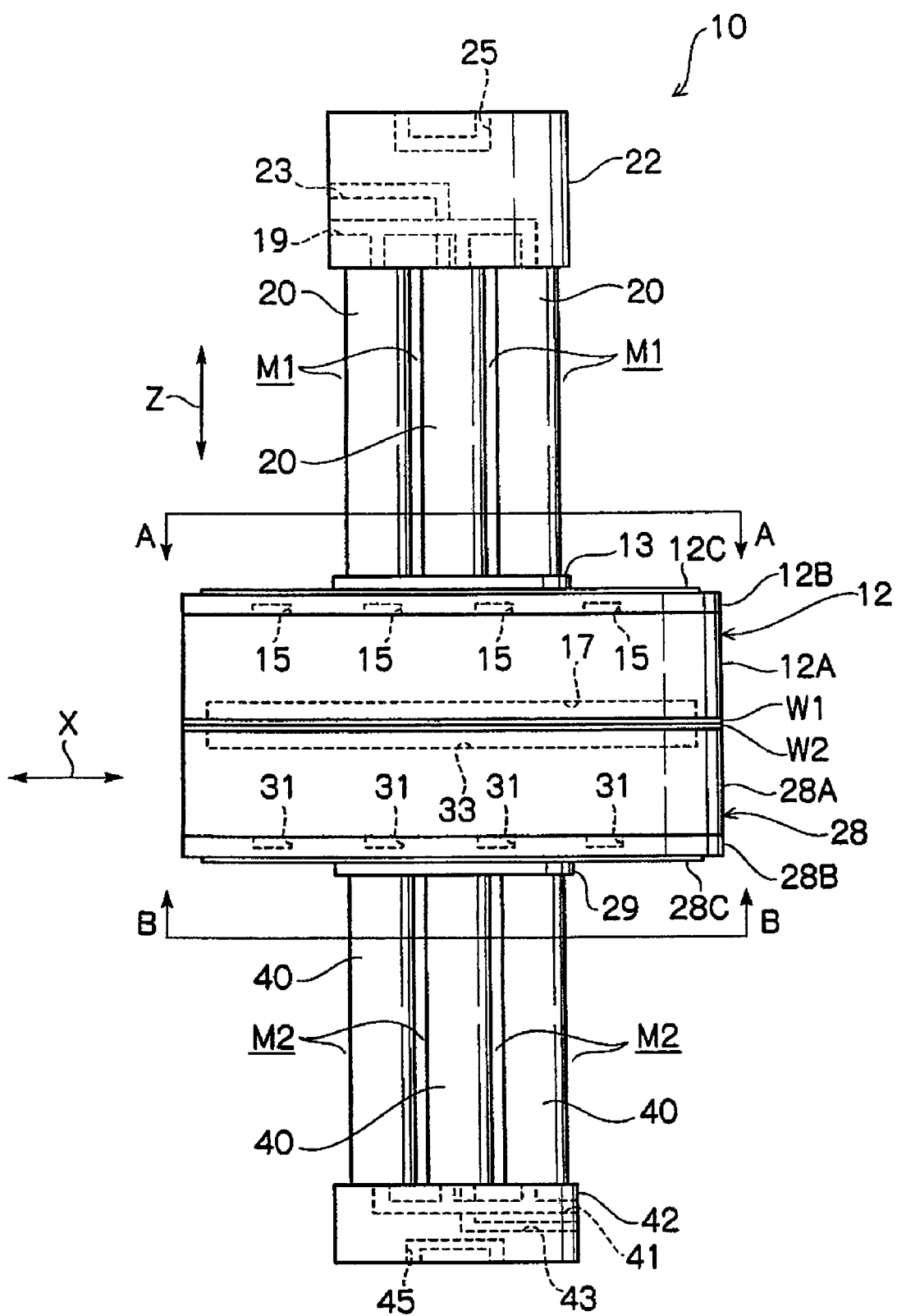
FIG. 2 is a schematic structural view showing a part of a bonding apparatus according to the embodiment.
Figure 3:
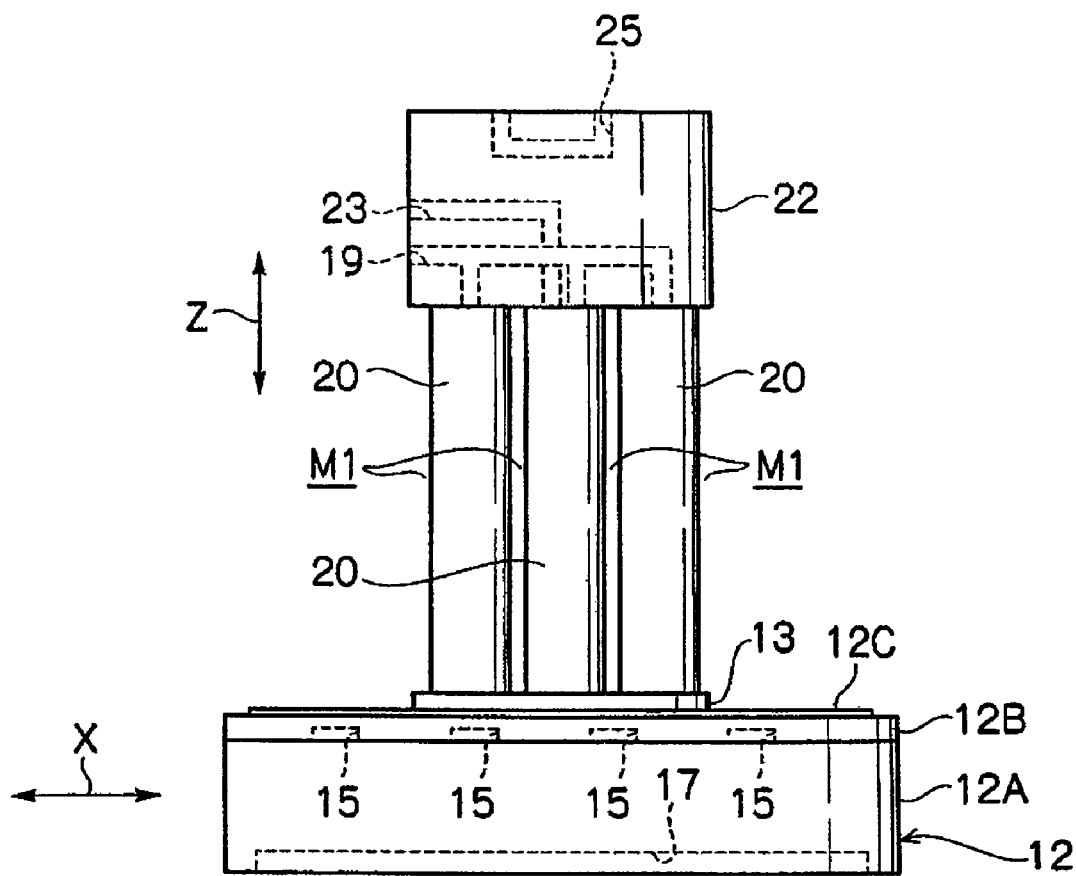
FIG. 3 is a schematic structural view showing a first block member, first flexible members, and a first pressure member that constitute the bonding apparatus according to the embodiment.
Figure 4:
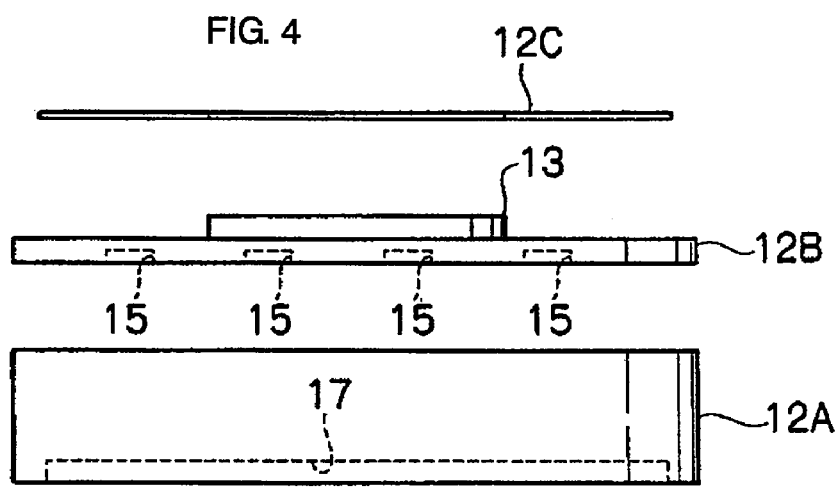
FIG. 4 is an exploded view of the first block member that constitutes the bonding apparatus according to the embodiment.

As shown in FIG. 1, a bonding apparatus 10 is provided in the airtight chamber 9. In other words, as shown in FIGS. 2 to 4, the bonding apparatus 10 includes a first presser plate 12A shaped like a cylinder and constituting the first block member 12. The first presser plate 12A is formed of silicon carbide (SiC) serving as a conductive material. The first presser plate 12A has a plurality of first drawing grooves 17 for air suction. A first wafer W1 serving as an object to be bonded is drawn on one end face of the first presser plate 12A in the width direction. The first wafer W1 has first alignment marks at positions corresponding to cutouts 36 provided in the second block member 28 that will be described below. On the other end face of the first presser plate 12A in the thickness direction, a first back plate 12B shaped like a disc is mounted. The first back plate 12B constitutes the first block member 12 with the first presser plate 12A, and has almost the same diameter as the diameter of the first presser plate 12A. The first back plate 12B is formed of aluminum nitride (AlN) serving as an insulating material. A projection 13 projecting in the thickness direction is provided integrally with almost the center of the first back plate 12B. On an end face of the first back plate 12B opposite the first presser plate 12A, a first heater chip 12C is mounted. The first heater chip 12C constitutes the first block member 12 with the first presser plate 12A and the first back plate 12B, and heats the first presser plate 12A. The first heater chip 12C is formed of silicon carbide (SiC). Since the first heater chip 12C is mounted on the first presser plate 12A formed of a conductive material so that the first back plate 12B formed of an insulating material is provided therebetween, the first heater chip 12C and the first presser plate 12A are electrically insulated from each other.

Figure 5:
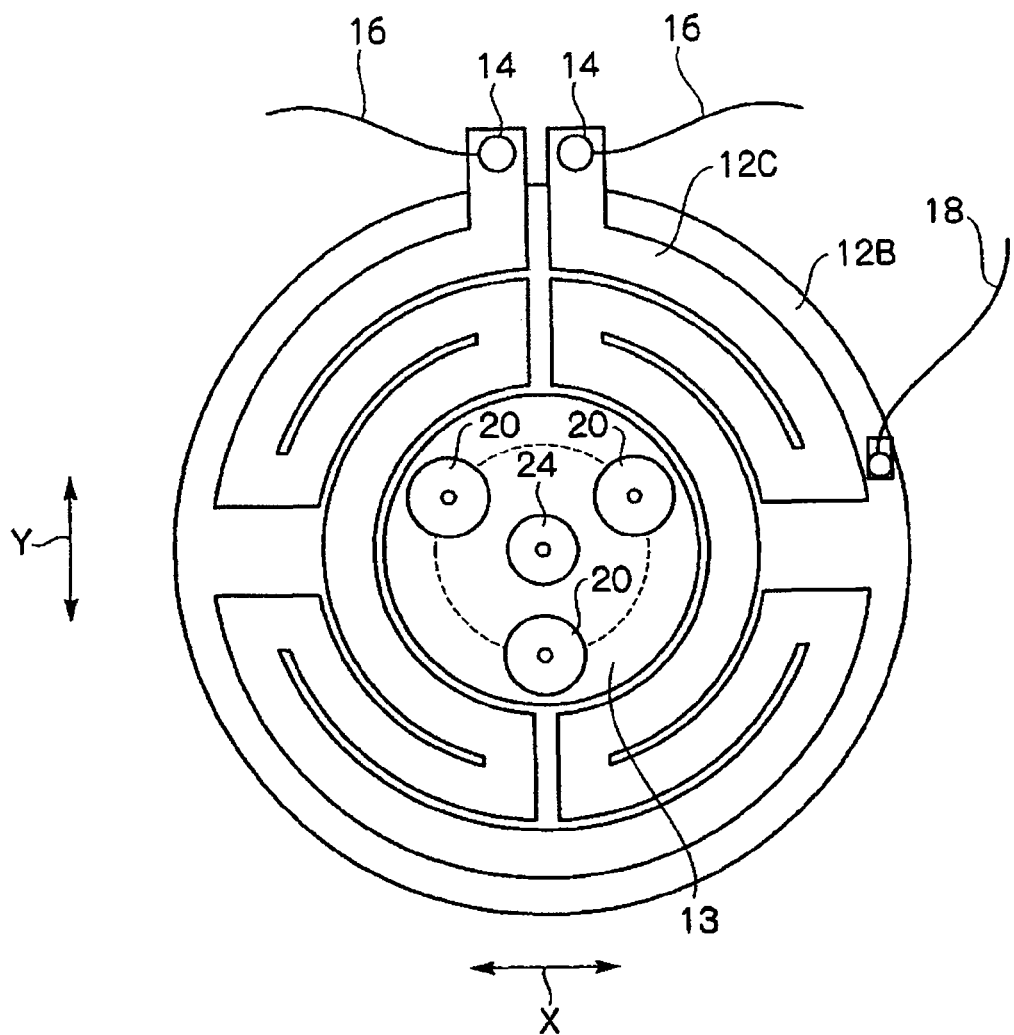
FIG. 5 is a cross-sectional view on arrow A-A shown in FIG. 2.

As shown in FIG. 5, the first heater chip 12C has a proper resistance, and feeder lines 16 are connected to two electrodes 14. The feeder lines 16 are connected to a temperature controller (not shown), and the current to be supplied to the first heater chip 12C via the feeder lines 16 is controlled by the temperature controller. By supplying a predetermined current to the first heater chip 12C via the feeder lines 16, the temperature of the first heater chip 12C is increased or decreased.

On the first back plate 12B and near the first heater chip 12C, a first thermocouple 18 is connected to measure the temperatures of the first presser plate 12A and the first back plate 12B. The first thermocouple 18 is connected to the above-described temperature controller. On the basis of the temperature measured by the first thermocouple 18, the current to be supplied to the first heater chip 12C is controlled by the temperature controller, and the temperatures of the first presser plate 12A and the back plate 12B are controlled to be arbitrary temperatures.

The first presser plate 12A, the first back plate 12B, and the first heater chip 12C have the same or almost the same coefficient of linear expansion, and have high thermal conductivity. The first presser plate 12A, the first back plate 12B, and the first heater chip 12C are connected by being fastened by bolts (not shown) formed of molybdenum.

As shown in FIGS. 2 to 4, first cooling grooves (first cooling-gas channels) 15 are provided in a contact surface between the first presser plate 12A and the first back plate 12B. More specifically, the first cooling grooves 15 having apertures are provided in the first back plate 12B. The apertures of the first cooling grooves 15 are closed by fastening the other end face of the flat first presser plate 12A in the thickness direction by bolts. The first cooling grooves 15 communicate with the outside. It is satisfactory as long as the first cooling grooves 15 are formed by fastening the first presser plate 12A and the first back plate 12B by bolts. For example, the first cooling grooves 15 may be provided in the first presser plate 12A, or may be provided in both the first presser plate 12A and the first back plate 12B. Into the first cooling grooves 15, $N_2$ gas serving as cooling gas is supplied, and the $N_2$ gas flows in the first cooling grooves 15.

As shown in FIGS. 2 to 5, three first column members (first flexible members) 20 shaped like a rod and having the same size and the same shape are connected to a surface of the projection 13 on the first back plate 12B. The first column members 20 are formed of silicon nitride ($Si_3N_4$). The three first column members 20 are arranged concentrically with the centers of the first presser plate 12A and the first back plate 12B and at regular intervals (pitch of 120 degrees). The first column members 20 are connected at one end to the projection 13 on the first back plate 12B, and at the other end to the first pressure shaft (first pressure member) 22.

The diameter and axial length of the first column members 20 are set within a range such that the relationship therebetween satisfies the following condition:

$$3EAd\Delta y/l^2 < \sigma_{max}$$

where d represents the diameter of the first column members 20, l represents the axial length of the first column members 20, E represents the Young's modulus, $\sigma_{max}$ represents the maximum flexural strength, A represents the safety factor, and $\Delta y$ represents the difference in bending between both ends of the first column members 20. The safety factor A is 1 or more, and it is preferable to use a safety factor of about 8.

The first column members 20 are hollow, and communicate at one end with the first cooling grooves 15. The first column members 20 communicate at the other end with a first $N_2$-gas supply channel (first cooling-gas supply channel) 19 provided in the first pressure shaft 22 which will be described below. $N_2$ gas supplied from the first $N_2$-gas supply channel 19 into the first column members 20 is supplied to the first cooling grooves 15, thereby cooling the first presser plate 12A and the first back plate 12B. The $N_2$ gas supplied in the first cooling grooves 15 is exhausted outside after the first presser plate 12A and the first back plate 12B are cooled.

As described above, the first column members 20 are connected at the other end to the first pressure shaft (first pressure member) 22. Pressure is applied from the first pressure shaft 22 to the first block member 12 via the first column members 20.

The coefficient of linear expansion of the first column members 20 is set so as not to be greatly different from the coefficient of linear expansion of the first presser plate 12A and the first back plate 12B. The thermal conductivity of the first column members 20 is set to be less than the thermal conductivity of the first presser plate 12A and the first back plate 12B.

Figure 6:
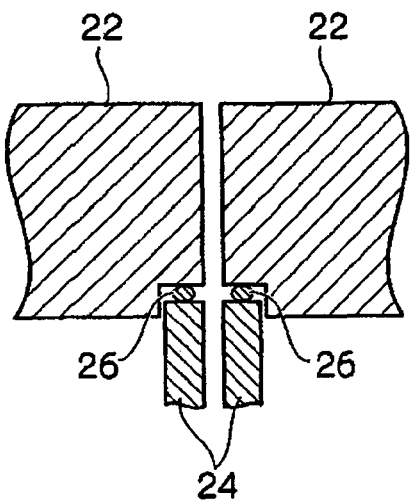
FIG. 6 is a schematic sectional view showing a connecting structure between the first pressure member and a first hollow duct that constitute the bonding apparatus according to the embodiment.

As shown in FIGS. 5 and 6, one first hollow member (first hollow duct) 24 having almost the same axial length as that of the first column members 20 is connected to the surface of the projection 13 on the first back plate 12B. The first hollow member 24 is connected above the centers of the first presser plate 12A and the first back plate 12B. The first hollow member 24 is connected at one end to the projection 13 on the first back plate 12B, and at the other end to the first pressure shaft 22 with a first O-ring (first elastic member) 26 disposed therebetween. In other words, as shown in FIG. 6, a clearance is provided between the other end of the first hollow member 24 and the first pressure shaft 22. The other end of the first hollow member 24 and the first pressure shaft 22 are not directly connected, but are connected to each other by the first O-ring 26. The first O-ring 26 is formed of rubber serving as an elastic material.

At the other end of the first hollow member 24, a first air channel 23 is provided in a shaft body 22B of the first pressure shaft 22. Air from the first hollow member 24 flows in the first air channel 23. Accordingly, the first drawing grooves 17 and the first air channel 23 communicate with each other, and air can be introduced from the first drawing grooves 17.

As shown in FIG. 2, the bonding apparatus 10 includes the first pressure shaft (first pressure member) 22. In the shaft body 22B of the first pressure shaft 22, the first $N_2$-gas supply channel (first cooling-gas supply channel) 19 is provided so that $N_2$ gas to be supplied into the first column members 20 flows therein. In the shaft body 22B of the first pressure shaft 22, the above-described first air channel 23 is also provided. Further, in the shaft body 22B of the first pressure shaft 22, a first cooing-fluid circulation path 25, in which cooling fluid for cooling the first pressure shaft 22 itself circulates, is provided.

The bonding apparatus 10 is connected to a $N_2$-gas supply unit (not shown) for supplying $N_2$ gas to the first $N_2$-gas supply channel 19, an air supply unit (not shown) for supplying air (cooling air) to the first cooling-fluid circulation path 25, and a suction pump (not shown) for evacuating the first air channel 23. Accordingly, it is possible to supply $N_2$ gas into the first $N_2$-gas supply channel 19, to supply air into the first cooling-fluid circulation path 25, and to evacuate the first air channel 23.

As described above, the first pressure shaft 22 is connected to the Z-axis driving mechanism (not shown), and can be moved in the up-down direction (direction of arrow Z in FIG. 2) by the Z-axis driving mechanism. By thus moving the first pressure shaft 22 in the up-down direction (direction of arrow Z in FIG. 2), the first block member 12 can be moved in the up-down direction.

As described above, the load cell (not shown) is provided to measure the pressure acting on the first wafer W1. The Z-axis driving mechanism is controlled by the control unit 39 on the basis of the measurement value of the load cell. This allows a predetermined proper pressure to constantly acting on the first block member 12.

As described above, a first space section M1 is provided between the first block member 12 and the first pressure shaft 22, and the first column members 20 and the first hollow member 24 are provided in the first space section M1.

As shown in FIG. 1, the bonding apparatus 10 includes a second presser plate 28A shaped like a cylinder and constituting the second block member 28. The second presser plate 28A is formed of silicon carbide (SiC) serving as a conductive material. The second presser plate 28A has a plurality of second drawing grooves 33 for air suction. A second wafer W2 serving as an object to be bonded is drawn on one end face of the second presser plate 28A in the width direction. The second wafer W2 has second alignment marks at positions corresponding to the cutouts 36 in the second block member 28. On the other end face of the second presser plate 28A in the thickness direction, a second back plate 28B shaped like a disc is mounted. The second back plate 28B constitutes the second block member 28 with the second presser plate 28A, and has almost the same diameter as the diameter of the second presser plate 28A. The second back plate 28B is formed of aluminum nitride (AlN) serving as an insulating material. A projection 29 projecting in the thickness direction is provided integrally with almost the center of the second back plate 28B. On an end face of the second back plate 28B opposite the second presser plate 28A, a second heater chip 28C is mounted. The second heater chip 28B constitutes the second block member 28 with the second presser plate 28A and the second back plate 28B, and heats the second presser plate 28A. The second heater chip 28C is formed of silicon carbide (SiC). Since the second heater chip 28C is mounted on the second presser plate 28A formed of a conductive material so that the second back plate 28B formed of an insulating material is provided therebetween, the second heater chip 28C and the second presser plate 28A are electrically insulated from each other.

Figure 7:
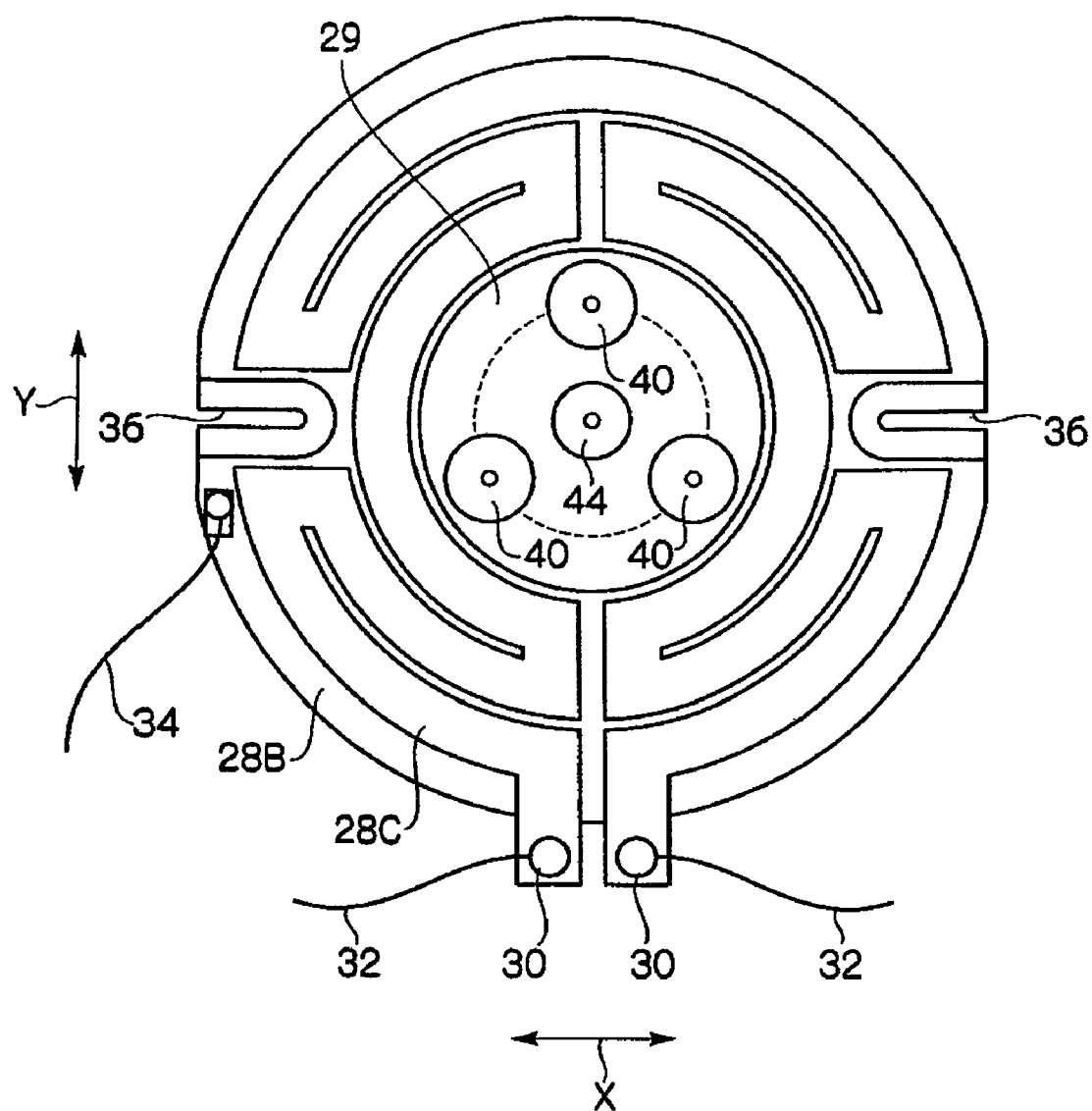
FIG. 7 is a cross-sectional view on arrow B-B shown in FIG. 2.

As shown in FIG. 7, the second heater chip 28C has a proper resistance, and feeder lines 32 are connected to two electrodes 30. The feeder lines 32 are connected to a temperature controller (not shown), and the current to be supplied to the second heater chip 28C via the feeder lines 32 is controlled by the temperature controller. By supplying a predetermined current to the second heater chip 28C via the feeder lines 32, the temperature of the second heater chip 28C is increased or decreased.

On the second back plate 28B and near the second heater chip 28C, a second thermocouple 34 is connected to measure the temperatures of the second presser plate 28A and the second back plate 28B. The second thermocouple 34 is connected to the above-described temperature controller. On the basis of the temperature measured by the second thermocouple 34, the current to be supplied to the second heater chip 28C is controlled by the temperature controller, and the temperatures of the second presser plate 28A and the second back plate 28B are controlled to be arbitrary temperatures.

The second presser plate 28A, the second back plate 28B, and the second heater chip 28C have the same or almost the same coefficient of linear expansion, and have high thermal conductivities. The second presser plate 28A, the second back plate 28B, and the second heater chip 28C are connected by being fastened by bolts (not shown) formed of molybdenum.

As shown in FIG. 2, second cooling grooves (second cooling-gas channels) 31 are provided in a contact surface between the second presser plate 28A and the second back plate 28B. More specifically, the second cooling grooves 31 having apertures are provided in the second back plate 28B, and the apertures of the second cooling grooves 31 are closed by fastening the other end face of the flat second presser plate 28A in the thickness direction by bolts. The second cooling grooves 31 communicate with the outside. It is satisfactory as long as the second cooling grooves 31 are formed by fastening the second presser plate 28A and the second back plate 28B by bolts. For example, the second cooling grooves 31 may be provided in the second presser plate 28A, or may be provided in both the second presser plate 28A and the second back plate 28B. Into the second cooling grooves 31, $N_2$ gas serving as cooling gas is supplied, and the $N_2$ gas flows in the second cooling grooves 31.

As shown in FIGS. 1 and 7, two cutouts (through portions) 36 extend in the thickness direction through each of the second presser plate 28A, the second back plate 28B, and the second heater chip 28C. The above-described two image recognizing devices 47 are provided in a second space section M2, which will be described below, and near the cutouts 36. The image recognizing devices 47 are connected to the control unit 39, and data on images taken by the cameras 47A are output to the control unit 39. The opening areas of the cutouts 36 are set to be larger on one side (side close to the image recognizing devices 47) in the thickness direction of the second presser plate 28A, the second back plate 28B, and the second heater chip 28C, and are set to decrease toward the other side (opposite the image recognizing devices 47) in the thickness direction of the second presser plate 28A, the second back plate 28B, and the second heater chip 28C.

Preferably, the cameras 47A constituting the image recognizing devices 47 are CCD cameras when the second wafer W2 is a glass wafer, and are infrared cameras when the second wafer W2 is a Si wafer. When CCD cameras are used as the cameras 47A, the second alignment marks on the second wafer W2 can be clearly recognized by applying light from the CCD cameras onto the second wafer W2.

As shown in FIG. 7, three second column members (second flexible members) 40 shaped like a rod and having the same size and the same shape are connected to a surface of the projection 29 on the second back plate 28B. The second column members 40 are formed of silicon nitride ($Si_3N_4$). The three second column members 40 are arranged concentrically with the centers of the second presser plate 28A and the second back plate 28B and at regular intervals (pitch of 120 degrees). The second column members 40 are connected at one end to the projection 29 on the second back plate 28B, and at the other end to the second pressure shaft (second pressure member) 42.

The diameter and axial length of the second column members 40 are set within a range such that the relationship therebetween satisfies the following condition:

$$3EAd\Delta y/l^2 < \sigma_{max}$$

where d represents the diameter of the second column members 40, l represents the axial length of the second column members 40, E represents the Young's modulus, $\sigma_{max}$ represents the maximum flexural strength, A represents the safety factor, and $\Delta y$ represents the difference in bending between both ends of the second column members 40. The safety factor A is 1 or more, and it is preferable to use a safety factor of about 8.

The second column members 40 are hollow, and communicate at one end with the second cooling grooves 31. The second column members 40 communicate at the other end with a second $N_2$-gas supply channel (second cooling-gas supply channel) 41 provided in the second pressure shaft 42 which will be described below. $N_2$ gas supplied from the second $N_2$-gas supply channel 41 into the second column members 40 is supplied to the second cooling grooves 31, thereby cooling the second presser plate 28A and the second back plate 28B. The $N_2$ gas supplied in the second cooling grooves 31 is exhausted outside after the second presser plate 28A and the second back plate 28B are cooled.

As shown in FIG. 2, the second column members 40 are connected at the other end to the second pressure shaft (second pressure member) 42. Pressure is applied from the second pressure shaft 42 to the second block member 28 via the second column members 20. As shown in FIG. 1, the second pressure shaft 42 is fixed to the bottom wall of the chamber 3, and moves in the XY-direction and rotates in the θ-direction together width the chamber 3.

The coefficient of linear expansion of the second column members 40 is set to be equal or substantially equal to the coefficient of linear expansion of the second presser plate 28A and the second back plate 28B. The thermal conductivity of the second column members 40 is set to be lower than the thermal conductivity of the second presser plate 28A and the second back plate 28B.

As shown in FIG. 7, one second hollow member (second hollow duct) 44 having almost the same axial length as that of the second column members 40 is connected to the surface of the projection 29 on the second back plate 28B. The second hollow member 44 is connected above the centers of the second presser plate 28A and the second back plate 28B. The second hollow member 44 is connected at one end to the projection 29 on the second back plate 28B, and at the other end to the second pressure shaft (second pressure member) 42 via a second O-ring (second elastic member, not shown). In other words, a clearance is provided between the other end of the second hollow member 44 and the second pressure shaft 42. The second hollow member 44 and the second pressure shaft 42 are not directly connected, but are connected to each other by the second O-ring. The second O-ring is formed of rubber serving as an elastic material.

At the other end of the second hollow member 44, a second air channel 43 is provided in the second pressure shaft 42. Air from the second hollow member 44 flows in the second air channel 43. Accordingly, the second drawing grooves 33 and the second air channel 43 communicate with each other, and air can be introduced from the second drawing grooves 33.

The bonding apparatus 10 includes the second pressure shaft 42. In the second pressure shaft 42, a second $N_2$-gas supply channel (second cooling-gas supply channel) 41 is provided so that $N_2$ gas to be supplied into the second column members 40 flows therein. In the second pressure shaft 42, the above-described second air channel 43 is also provided. Further, in the second pressure shaft 42, a second cooing-fluid circulation path 45 in which cooling air for cooling the second pressure shaft 42 itself circulates is provided.

The bonding apparatus 10 is connected to a $N_2$-gas supply unit (not shown) for supplying $N_2$ gas to the second $N_2$-gas supply channel 41, an air supply unit (not shown) for supplying air (cooling air) to the second cooling-fluid circulation path 45, and a suction pump (not shown) for evacuating the second air channel 43. Accordingly, it is possible to supply $N_2$ gas into the second N$_2$-gas supply channel 41, to supply air into the second cooling-fluid circulation path 45, and to evacuate the second air channel 43.

As described above, a second space section M2 is provided between the second block member 28 and the second pressure shaft 42, and the second column members 40 and the second hollow member 44 are provided in the second space section M2.

A description will now be given of an aligning method using the aligning device 1 according to this embodiment.

In this embodiment, nitrogen gas is introduced into the chamber 3, Si wafers are used as a first wafer W1 and a second wafer W2, and IR cameras are used as cameras 47A.

Figure 8:
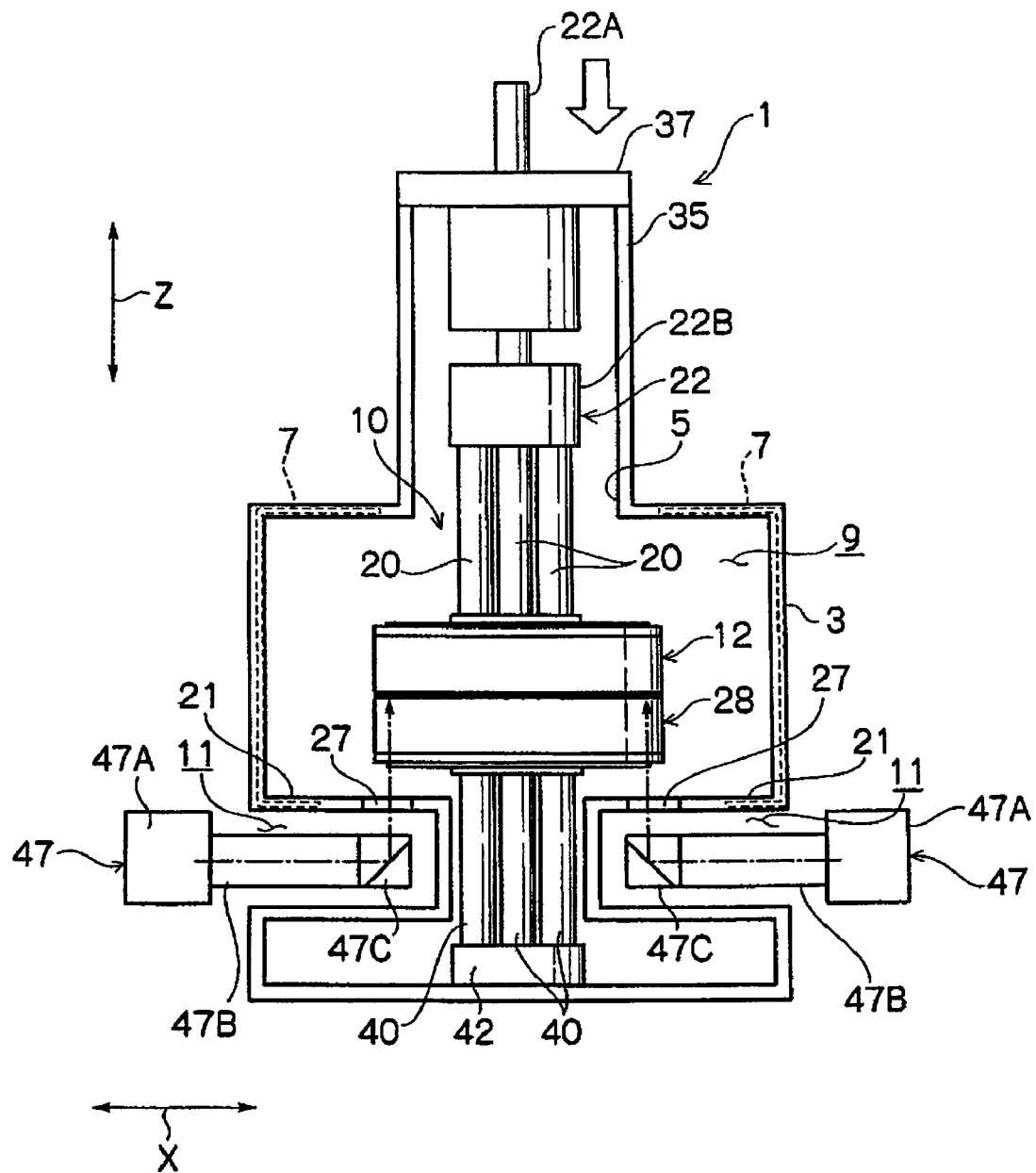
FIG. 8 is a view showing one process in an aligning method using the aligning device according to the embodiment.

As shown in FIG. 8, after a first wafer W1 and a second wafer W2 are first prealigned by a prealignment mechanism (not shown), the first wafer W1 is supplied to the first presser plate 12A and the second wafer W2 is supplied to the second presser plate 28A by a wafer loader (not shown). The first wafer W1 is drawn and held on the first presser plate 12A, and the second wafer W2 is drawn and held on the second presser plate 28A.

The first wafer W1 and the second wafer W2 are drawn when the suction pump starts and air flows from the first drawing grooves 17 and the second drawing grooves 33 into the first air channel 23 and the second air channel 43 through the first hollow member 24 and the second hollow member 44. Thereby, the first wafer W1 and the second wafer W2 can be reliably drawn, and misalignment of the first wafer W1 with the first presser plate 12A and misalignment of the second wafer W2 with the second presser plate 28A can be prevented. Soldering patterns serving as bonding material are formed on the first wafer W1 and the second wafer W2 beforehand. For this reason, solder material is melted into an alloy by pressing and heating the first wafer W1 and the second wafer W2, and the first wafer W1 and the second wafer W2 are bonded together.

Next, as shown in FIG. 8, the driving of the Z-axis driving mechanism is controlled by the control unit 39 so as to lower the first block member 12 and to thereby bring the first wafer W1 and the second wafer W2 into contact with each other. Thereby, first alignment marks provided on the first wafer W1 and second alignment marks provided on the second wafer W2 can be recognized in the same field of view of the cameras 47A. As a result, the first wafer W1 and the second wafer W2 can be aligned easily.

Subsequently, nitrogen gas is supplied into the chamber 3 by a nitrogen-gas supply device (not shown) that is provided separately.

Figure 9:
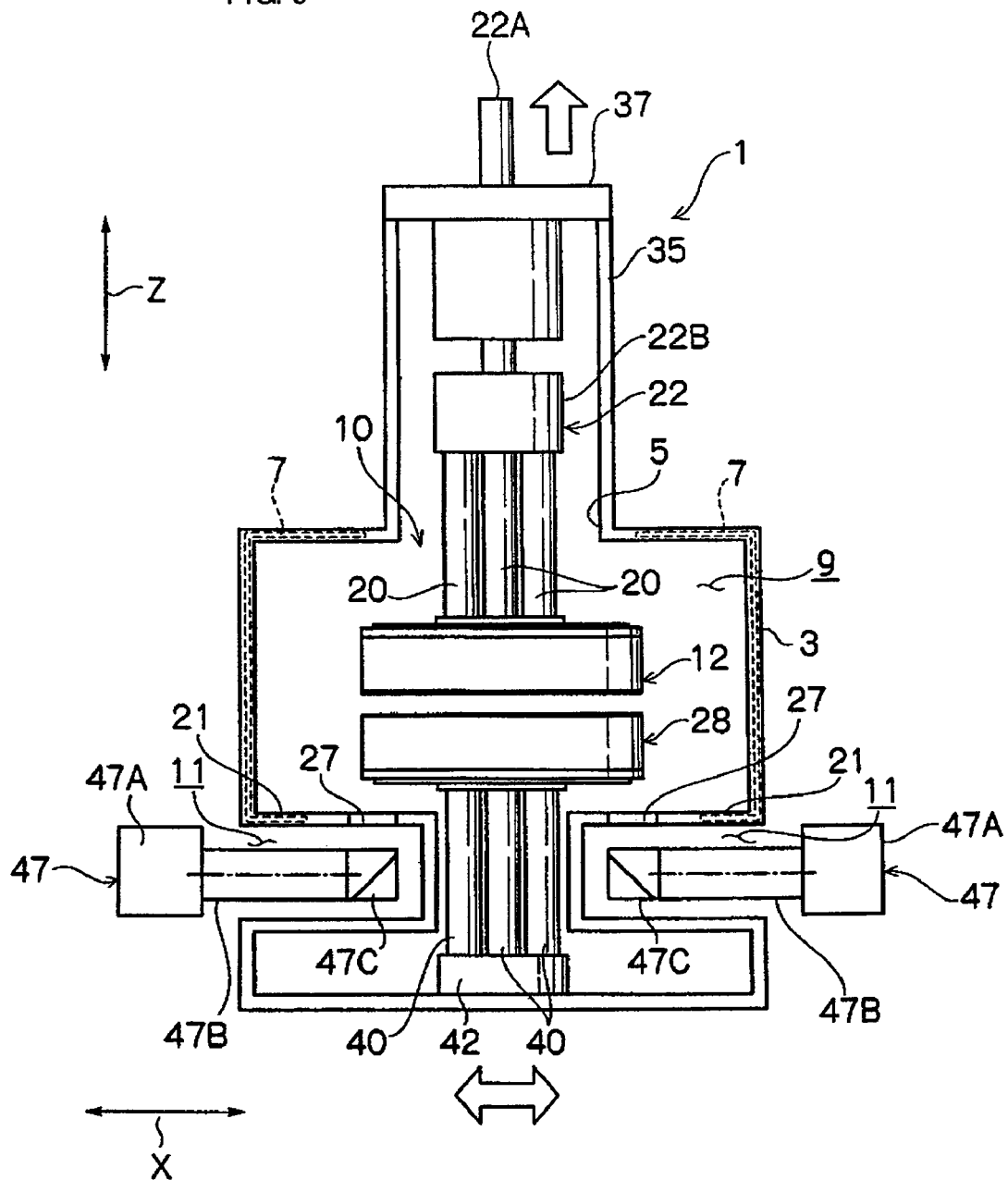
FIG. 9 is a view showing one process in the aligning method using the aligning device according to the embodiment.

Next, as shown in FIG. 9, images of the first alignment marks provided on the first wafer W1 and the second alignment marks provided on the second wafer W2 are taken by the image recognizing devices 47. Images of the first alignment marks on the first wafer W1, besides the second alignment marks on the second wafer 2, are taken through the second wafer W2. The taken images are transmitted as image data to the control unit 39. When the image data is transmitted to the control unit 39, the amount of misalignment between the first alignment marks provided on the first wafer W1 and the second alignment marks provided on the second wafer W2 is calculated from the image data by the CPU of the control unit 39. On the basis of the calculated amount of misalignment, the amount of correction for correcting the misalignment between the first alignment marks provided on the first wafer W1 and the second alignment marks provided on the second wafer W2 is calculated by the CPU of the control unit 39.

Next, as shown in FIG. 9, the driving of the Z-axis driving mechanism is controlled by the control unit 39, and the first block member 12 is moved in a direction in which the distance from the second block member 28 increases (upward). This increases the distance between the first wafer W1 and the second wafer W2.

Next, as shown in FIG. 9, the XY stage 52 and the rotating stage 54 are driven by the control unit 39 in accordance with the calculated amount of correction. Thereby, the second block member 28 is moved relative to the first block member 12 in the XY-direction or the θ-direction, and misalignment between the first alignment marks on the first wafer W1 and the second alignment marks on the second wafer W2 is corrected. This removes misalignment between the first alignment marks on the first wafer W1 and the second alignment marks on the second wafer W2.

Figure 10:
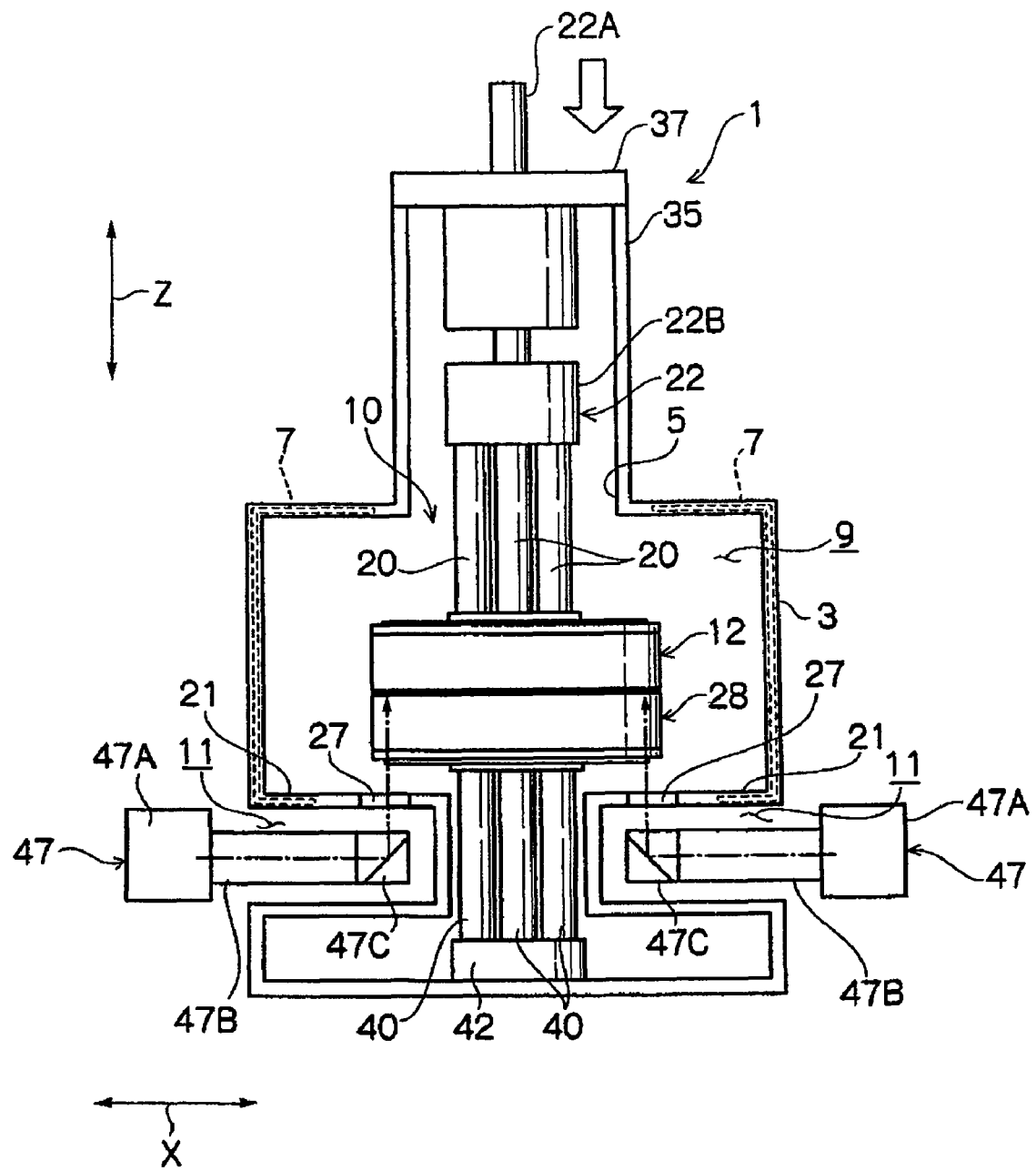
FIG. 10 is a view showing one process in the aligning method using the aligning device according to the embodiment.

Next, as shown in FIG. 10, the driving of the Z-axis driving mechanism is controlled by the control unit 39 so as to lower the first block member 12 and to thereby bring the first wafer W1 and the second wafer W2 into contact with each other.

Next, as shown in FIG. 10, images of the first alignment marks provided on the first wafer W1 and the second alignment marks provided on the second wafer W2 are taken by the image recognizing devices 47, and it is confirmed whether the marks are misaligned. When the marks are misaligned, the amount of misalignment is calculated by the CPU of the control unit 39. After the amount of correction is calculated from the amount of misalignment, the first block member 12 is moved up again, and the second block member 28 is moved relative to the first block member 12 in the XY-direction or the θ-direction so as to remove misalignment.

As described above, the image recognizing devices 47 are provided in the spaces 11 defined by the image-taking ports 21, images of the first wafer W1 and the second alignment marks on the second wafer W2 provided in the airtight chamber 9 are taken through the observation windows 27, and the second block 28 is moved relative to the first block member 12 by the control unit 39 according to data on the taken images. Consequently, the first wafer W1 held in the first block member 12 and the second wafer W2 held in the second block member 28 can be relatively moved, and the first wafer W1 and the second wafer W2 can be aligned.

Since the image-taking ports 21 protrude inward from the outer surface of the chamber 3 so as to define the spaces 11, even when the chamber 3 moves together with the second block member 28, the image recognizing devices 47 provided in the spaces 11 are prevented from interfering with the movement of the chamber 3. Therefore, the chamber 3 can be freely moved without any restriction. As a result, the second block member 28 can be freely moved relative to the first block member 12 without being restricted by the placement of the image recognizing devices 47, and the first wafer W1 and the second wafer W2 can be aligned reliably.

In particular, the amount of misalignment between the images of the first alignment marks on the first wafer W1 and the second alignment marks on the second wafer W2 taken by the image recognizing devices 47 is calculated by the CPU of the control unit 39, the amount of correction for correcting the amount of misalignment is also calculated, and the XY stage 52 and the rotating stage 54 are controlled so as to correct the amount of misalignment. Consequently, the second block member 28 can be moved so as to remove the misalignment between the first alignment marks on the first wafer W1 and the second alignment marks on the second wafer W2. As a result, the accuracy in aligning the first wafer W1 and the second wafer W2 can be increased.

Further, since the first block member 12 is moved in a direction in which the distance from the second block member 28 increases, the first wafer W1 and the second wafer W2 are prevented from coming into contact with each other when the second block member 28 is moved relative to the first block member 12. This can prevent the quality from being lowered by damage and breakage of the first wafer W1 and the second wafer W2.

The translation in the XY-direction and rotation in the θ-direction of the second wafer W2 are performed by driving the entire chamber 3. Therefore, driving can be performed more precisely than in a case in which the movement is introduced from the outside of the chamber 3, and the wafers W1 and W2 in the chamber 3 can be aligned with high accuracy. Further, since the image-taking ports 21 are provided in the chamber 3, images of the alignment marks provided on the wafers W1 and W2 can be taken at a short distance and with a large magnification. This allows the alignment accuracy to be easily checked before bonding the wafers W1 and W2.

A description will now be given of a bonding method using the bonding apparatus 10 of this embodiment, that is, a procedure in which the wafers W1 and the wafer W2 are bonded after aligned by the aligning device 1.

As shown in FIG. 2, when alignment of the second wafer W2 with the first wafer W1 is completed, a predetermined pressure is applied from the first pressure shaft 22 to the first block member 12 via the first column members 20.

The first block member 12 is pressed against the second block member 28 by applying a predetermined torque to the motor by the control unit 39 in accordance with the load measured by the load cell. In this case, when the pressure in the chamber 3 is different from the atmospheric pressure, the load measured by the load cell is corrected in accordance with the pressure in the chamber 3 measured by a pressure gauge provided separately (not shown) so that an optimum pressure acts between the first wafer W1 and the second wafer W2. This allows an optimum pressure to act between the first wafer W1 and the second wafer W2, and improves the accuracy in bonding the wafers and the quality after bonding. Since stages capable of receiving a heavy load can be selected as the XY stage 52 and the rotating stage 54 provided outside the chamber 3, the wafers W1 and W2 can be press-bonded with a high pressure.

Subsequently, as shown in FIG. 5, a current is supplied from the feeder lines 16 to the first heater chip 12C so as to heat the first block member 12. In this case, since the current to be supplied to the first heater chip 12C is controlled by the temperature controller in accordance with the temperature measured by the first thermocouple 18, the temperatures of the first presser plate 12A and the first back plate 12B are controlled arbitrarily. Similarly, as shown in FIG. 7, a current is supplied from the feeder lines 32 to the second heater chip 28C so as to heat the second block member 28. In this case, since the current to be supplied to the second heater chip 28C is controlled by the temperature controller in accordance with the temperature measured by the second thermocouple 34, the temperatures of the second presser plate 28A and the second back plate 28B are controlled arbitrarily. Consequently, the first wafer W1 and the second wafer W2 can be heated to a predetermined temperature.

When the first block member 12 and the second block member 28 are heated, they thermally expand. Since an insulator is not used, the first space section M1 is provided between the first block member 12 and the first pressure shaft 22, and the second space section M2 is provided between the second block member 28 and the second pressure shaft 42, most heat to be transferred from the first block member 12 and the second block member 28 to the first pressure shaft 22 and the second pressure shaft 42 is insulated by the first space section M1 and the second space section M2. This allows the temperatures in the first block member 12 and the second block member 28 to be substantially uniform. When the first wafer W1 and the second wafer W2 are in contact with each other, the temperatures of the first block member 12, the second block member 28, the first wafer W1, and the second wafer W2 can be substantially uniform as a whole. As a result, flatnesses of a surface of the first block member 12 on which the first wafer W1 is held and a surface of the second block member 28 on which the second wafer W2 is held can be maintained.

Even when the first block member 12 and the second block member 28 are heated, since the first space section M1 and the second space section M2 are provided, little heat is transferred from the first block member 12 and the second block member 28 to the first pressure shaft 22 and the second pressure shaft 42. Since the portions to be heated by the first heater chip 12C and the second heater chip 28C are substantially limited to the first block member 12, the second block member 28, the first wafer W1, and the second wafer W2, the heat capacity of the heated portions is reduced, and the time needed to heat and cool the first wafer W1 and the second wafer W2 can be shortened. This can increase the availability ratio of the bonding apparatus 10.

Stress generated by a difference in thermal expansion between the first block member 12 and the second block member 28, and the first pressure shaft 22 and the second pressure shaft 42 can be absorbed by bending of the first column members 20 and the second column members 40. In other words, since the first column members 20 and the second column members 40 are shaped like rods, the flexural rigidity thereof is relatively small. Therefore, the first column members 20 and the second column members 40 can be bent to absorb the difference in the amount of thermal expansion without warping the first block member 12 and the second block member 28. As a result, flatnesses of the surface of the first block member 12 holding the first wafer W1 and the surface of the second block member 28 holding the second wafer W2 can be maintained.

In this case, since a plurality of first column members 20 are equally spaced on the circumference concentric with the center of the first block member 12, the center of the first block member 12 and the center of the first pressure shaft 22 are not misaligned by bending of the first column members 20. Since a plurality of second column members 40 are also equally spaced on the circumference concentric with the center of the second block member 28, the center of the second block member 28 and the center of the second pressure shaft 42 are not misaligned by bending of the second column members 40. Therefore, the first wafer W1 and the second wafer W2 are not misaligned and stress is not imposed thereon by heating.

Since a plurality of first column members 20 are equally spaced on the circumference concentric with the center of the first block member 12, pressure is transferred from the first pressure shaft 22 to the first block member 12 in a well-balanced manner. Since a plurality of second column members 40 are equally spaced on the circumference concentric with the center of the second block member 28, pressure is transferred from the second pressure shaft 42 to the second block member 28 in a well-balanced manner. Therefore, pressure to be applied to the first wafer W1 and the second wafer W2 is proper with little in-plane variation.

In particular, the first block member 12 is constituted by the first presser plate 12A, the first back plate 12B, and the first heater chip 12C, and the coefficients of linear expansion of the first presser plate 12A, the first back plate 12B, and the first heater chip 12C are set to be equal or substantially equal. Therefore, the difference in amount of thermal expansion among the first presser plate 12A, the first back plate 12B, and the first heater chip 12C can be reduced. This prevents warping of the first block member 12 and maintains the flatness of the first block member 12. This also applies to the second block member 28, and the flatness of the second block member 28 can be maintained.

After the first wafer W1 and the second wafer W2 are bonded by a proper pressure, supply of current to the first heater chip 12C is stopped, and $N_2$ gas is supplied from the first column members 20 to the first cooling grooves 15 in the first block member 12. This $N_2$ gas is supplied from the $N_2$-gas supply unit into the first $N_2$-gas supply channel 19 of the first pressure shaft 22, and is thereby supplied from the first column members 20 into the first cooling grooves 15 of the first block member 12. Consequently, the first block member 12 can be quickly cooled, and the temperature of the first wafer W1 can be decreased quickly. Similarly, supply of current to the second heater chip 28C is stopped, and $N_2$ gas is supplied from the second column members 40 to the second cooling grooves 31 of the second block member 28. This $N_2$ gas is supplied from the $N_2$-gas supply unit into the second $N_2$-gas supply channel 41 of the second pressure shaft 42, and is thereby supplied from the second column members 40 into the second cooling grooves 31 of the second block member 28. Consequently, the second block member 28 can be quickly cooled, and the temperature of the second wafer W2 can be decreased quickly.

When the first block member 12 and the second block member 28 are cooled, the column members 20 and 40 can be bent so as to maintain the flatnesses of the first block member 12 and the second block member 28, in a manner similar to that adopted when the first block member 12 and the second block member 28 are heated.

In particular, the first column members 20 and the second column members 40 also have a cooling-gas supply function of supplying $N_2$ gas to the first cooling grooves 15 and the second cooling grooves 31 by passing $N_2$ gas therethrough. Therefore, the first column members 20 and the second column members 40 can be utilized as means for supplying $N_2$ gas to the first cooling grooves 15 and the second cooling grooves 31.

As shown in FIG. 6, since the first hollow member 24 is connected to the first pressure shaft 22 via the first O-ring 26, when a difference in amount of thermal deformation is formed between the first column members 20 and the first hollow member 24, for example, during cooling, stress to be transferred from the first pressure shaft 22 to the first block member 12 via the first hollow member 24 can be absorbed by elastic deformation of the first O-ring 26. Consequently, it is possible to prevent the stress from being transferred from the first pressure shaft 22 to the first block member 12 via the first hollow member 24, and to maintain the flatness of the first block member 12. This also applies to the second hollow member 44, and the flatness of the second block member 28 can be maintained.

After the temperatures of the first wafer W1 and the second wafer W2 become low, the supply of $N_2$ gas and operation of the suction pump are stopped, and a bonded wafer formed by bonding the first wafer W1 and the second wafer W2 can be taken out of the bonding apparatus 10. In this case, in a state in which the bonded wafer formed by bonding the first wafer W1 and the second wafer W2 is drawn on the second block member 28, the first block member 12 is lifted by the Z-axis driving mechanism, and the bonded wafer is then freed from the second block member 28 and is taken out by a wafer loader that is not shown.

As described above, according to the bonding apparatus 10 of this embodiment, after the first wafer W1 and the second wafer W2 are precisely aligned, they can be bonded while maintaining the flatnesses of the first wafer W1 and the second wafer W2 without any influence of heat. As a result, the bonding strength therebetween can be extremely increased, and stabilized.

In particular, since the first $N_2$-gas supply channel 19 in which $N_2$ gas to be supplied to the first column members 20 flows and the first air channel 23 in which air from the first hollow member 24 flows are provided in the first pressure shaft 22, as described above, the first pressure shaft 22 can be utilized as a part of cooling-gas supply means and as a part of air exhaust means. This also applies to the second pressure shaft 42. From the above, it is unnecessary to directly connect tubes to the first block member 12 and the second block member 28 that are heated to a high temperature, and cooling and vacuum drawing can be performed easily.

Since the first cooling-fluid circulation path 25 in which cooling air for cooling the first pressure shaft 22 circulates is provided in the first pressure shaft 22, the first pressure shaft 22 can be constantly cooled by circulating cooling air in the first cooling-fluid circulation path 25. Since the first pressure shaft 22 can be thereby kept at a lower temperature even during the operation of the bonding apparatus 10, for example, tubes for supplying cooling gas and cooling air to the first pressure shaft 22 or exhausting air from the first pressure shaft 22 can be easily connected without placing any restrictions on the material of the tubes. This also applies to the second pressure shaft 42.

While the first wafer W1 and the second wafer W2 are heated and bonded by thermal compression bonding in the above-described embodiment, the bonding method is not limited thereto. For example, the first and second wafers W1 and W2 may be bonded by anode coupling. In other words, the first presser plate 12A and the second presser plate 28A are formed of a conductive material and the first back plate 12B and the second back plate 28B are formed of an insulating material so as to electrically insulate the first presser plate 12A and the first heater chip 12C and to electrically insulate the second presser plate 28A and the second heater chip 28C. Consequently, a Si wafer and a glass wafer can be bonded by anode coupling by applying a predetermined voltage to the first presser plate 12A and the second presser plate 28A while the first presser plate 12A and the second presser plate 28A are heated. As a result, variations can be added to the bonding method.

A description will now be given of a modification of an aligning method using the aligning device 1 of this embodiment. In this embodiment, a vacuum atmosphere is provided in a chamber 3, Si wafers are used as a first wafer W1 and a second wafer W2, and visible light cameras are used as cameras 47A. Since the first wafer W1 and the second wafer W2 are bonded in the above-described method, a description of the method will be omitted.

First, after the first wafer 1 and the second wafer W2 are prealigned by a prealignment mechanism (not shown), the first wafer W1 is supplied to a first presser plate 12A and the second wafer W2 is supplied to a second presser plate 28A by a wafer loader (not shown). The first wafer W1 is drawn and held on the first presser plate 12A, and the second wafer W2 is drawn and held on the second presser plate 28A.

Figure 11:
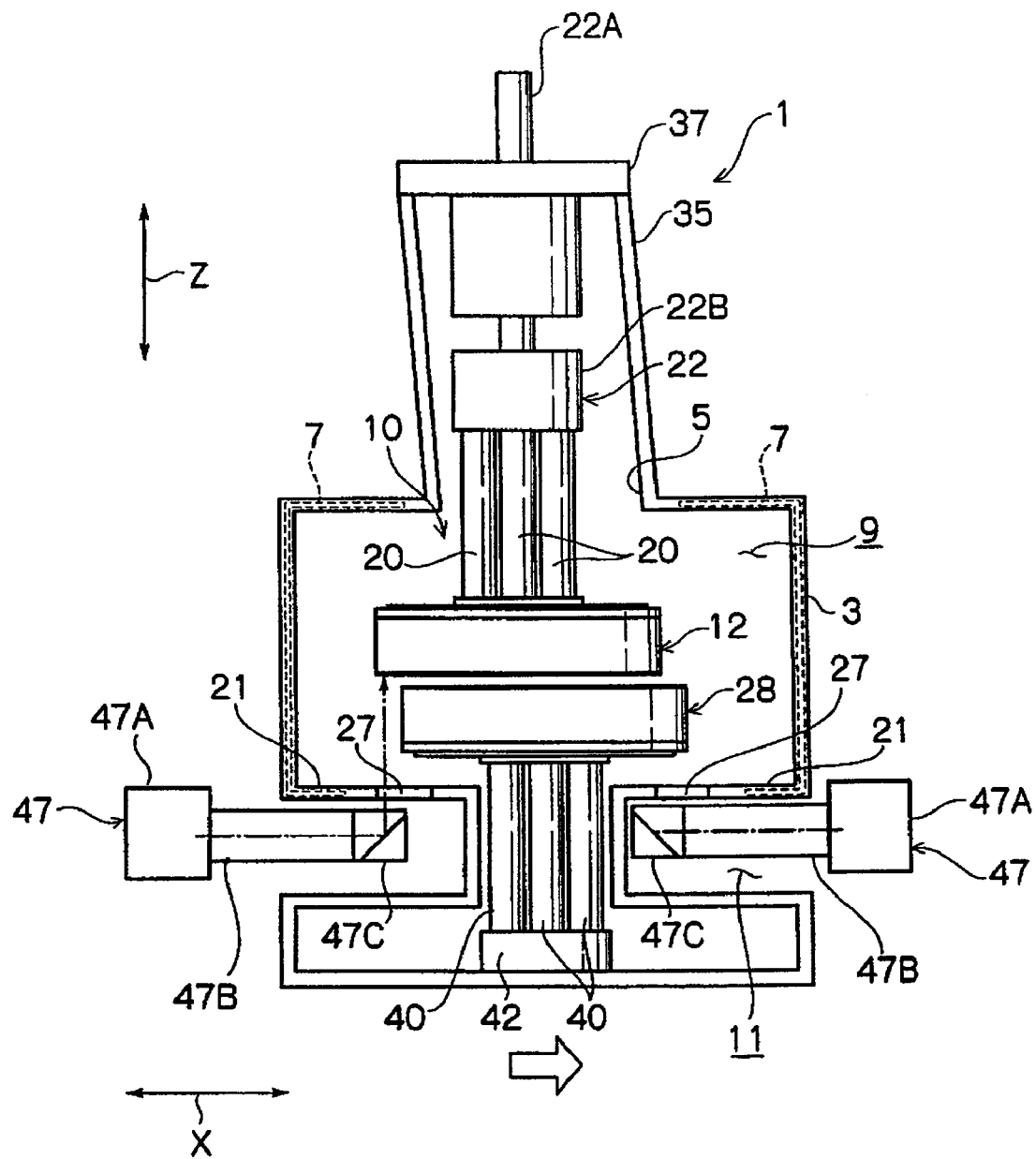
FIG. 11 is a view showing one process in a modification of an aligning method using the aligning device according to the embodiment n.

Next, as shown in FIG. 11, an XY table 52 is driven to the right so as to move a second block member 28 to the right.

Then, an image of a first alignment mark provided on the left side of the first wafer W1 is taken by a left image recognizing device 47.

Figure 12:
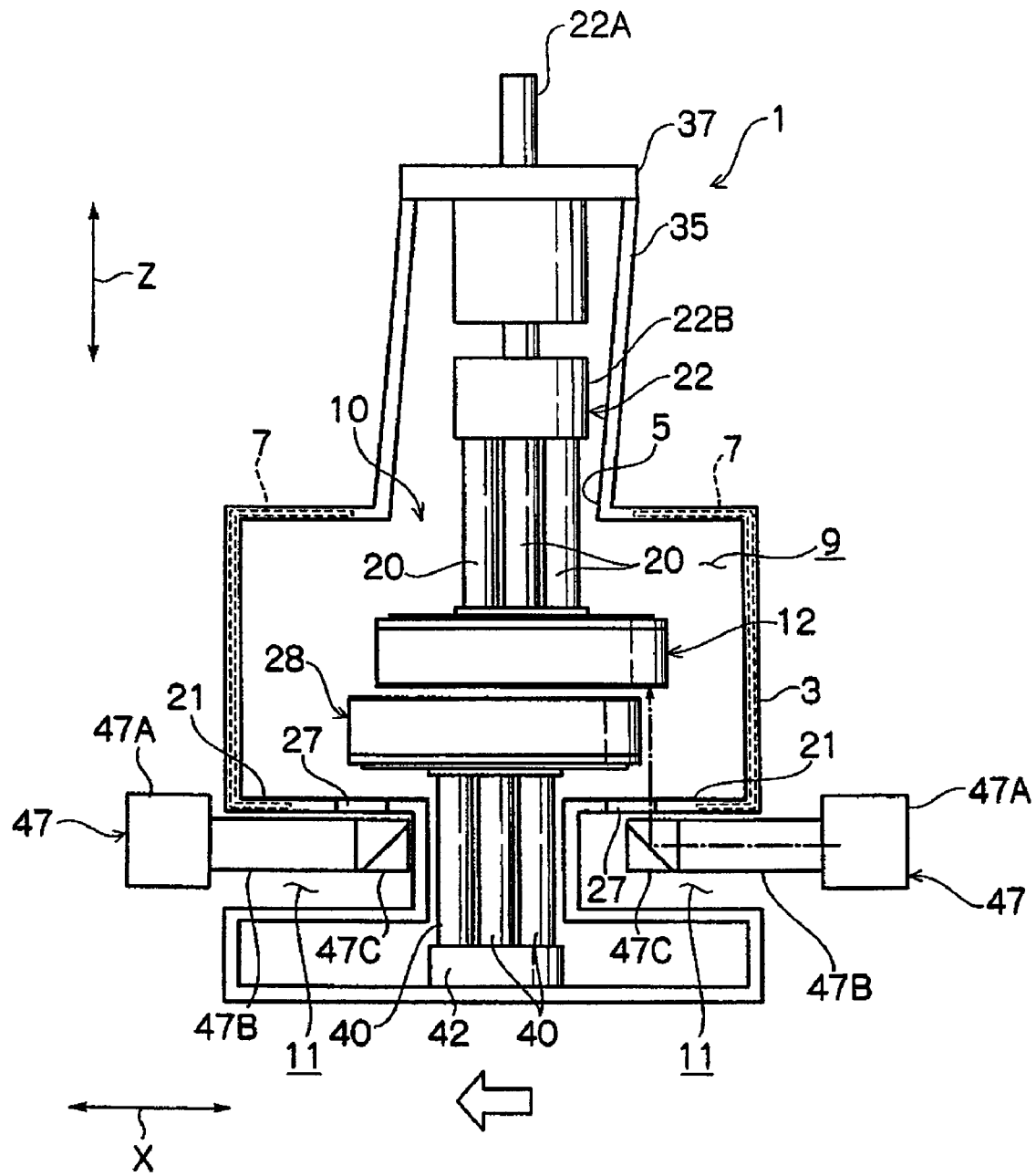
FIG. 12 is a view showing one process in the modification of the aligning method using the aligning device according to the embodiment.

Then, as shown in FIG. 12, the XY table 52 is driven to the left so as to move the second block member 28 to the left. Then, an image of a first alignment mark provided on the right side of the first wafer W1 is taken by a right image recognizing device 47.

Figure 13:
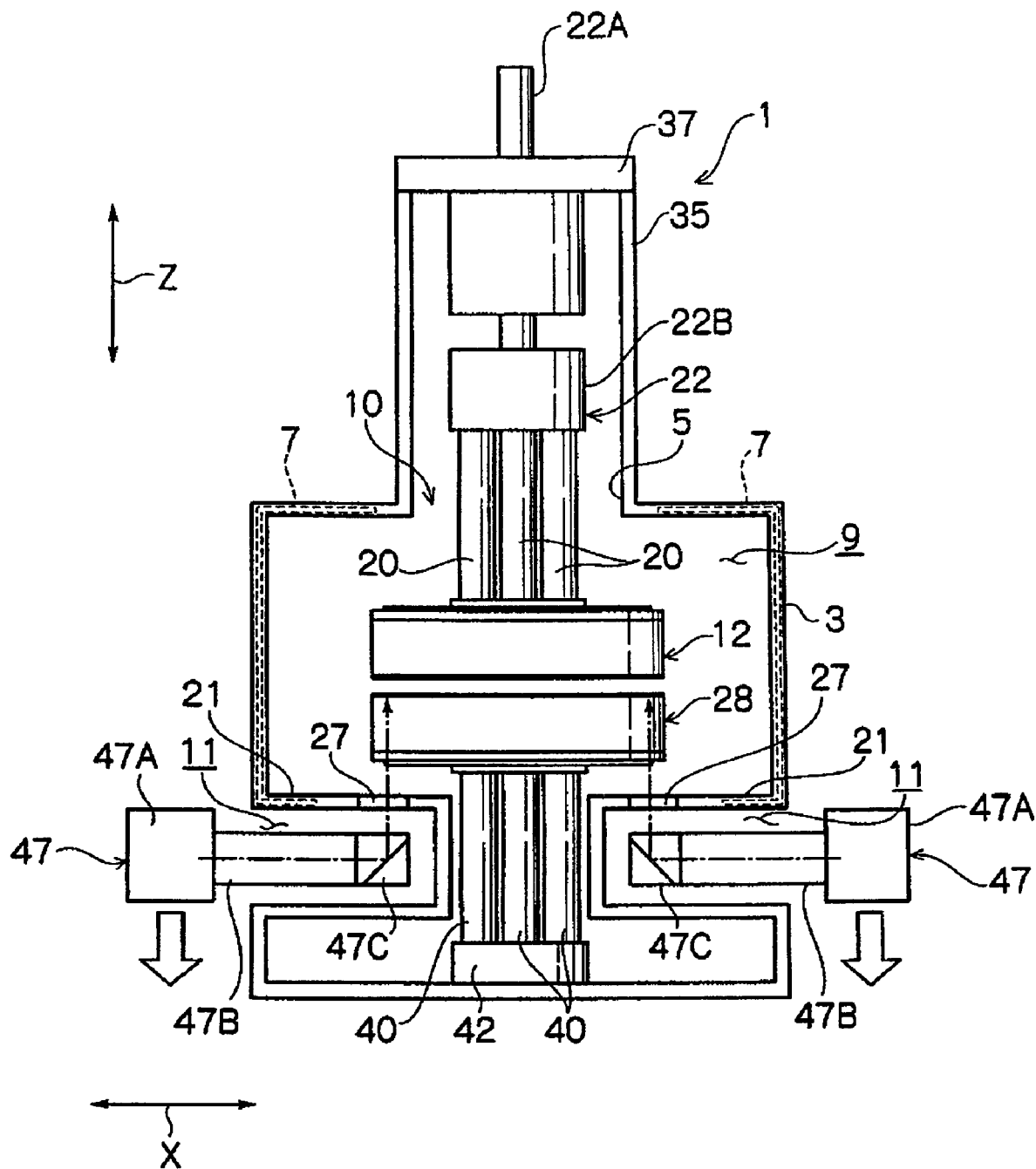
FIG. 13 is a view showing one process in the modification of the aligning method using the aligning device according to the embodiment.

After a Z-axis camera actuator 50 is driven downward and focus is adjusted onto second alignment marks provided on the second wafer W2, as shown in FIG. 13, images of the second alignment marks on the right and left sides of the second wafer W2 are respectively taken by the right and left image recognizing devices 47.

As shown in FIG. 13, the amount of misalignment between the first wafer W1 and the second wafer W2 is calculated by a CPU of a control unit 39 according to data on the images taken by the cameras 47A, and the amount of correction for correcting the misalignment is calculated from the calculated amount of misalignment. As shown in FIG. 14, the driving of the XY stage 52 and a rotating stage 54 is controlled by the control unit 39 in accordance with the calculated amount of correction, thus aligning the first wafer W1 and the second wafer W2.

Next, as shown in FIG. 15, a Z-axis driving mechanism is controlled by the control unit so as to lower the first block member 12 and to bring the first wafer W1 and the second wafer W2 into contact with each other.

Then, the chamber 3 is evacuated. The first wafer W1 and the second wafer W2 are bonded by the above-described method.

As described above, according to this modification, even when IR cameras cannot be used as the cameras 47A of the image recognizing devices 47 and the two wafers W1 and W2 are opaque, the first wafer W1 and the second wafer W2 can be aligned by the above-described aligning method. Further, even when a vacuum atmosphere is necessary in the chamber 3, alignment can be performed by vacuum drawing without using, for example, an electrostatic chuck.

A description will now be given of a modification of an alignment method using the aligning device 1 of this embodiment. In this embodiment, a vacuum atmosphere is provided in a chamber 3, a Si wafer is used a first wafer W1, a glass wafer is used as a second wafer W2, and visible light cameras are used as cameras 47A.

First, after the first wafer W1 and the second wafer W2 subjected to cleaning are prealigned by a prealignment mechanism (not shown), the first wafer W1 is supplied to a first presser plate 12A and the second wafer W2 is supplied to a second presser plate 28A by a wafer loader (not shown). The first wafer W1 is drawn and held on the first presser plate 12A, and the second wafer W2 is drawn and held on the second presser plate 28A.

Then, as shown in FIG. 8, the driving of a Z-axis driving mechanism is controlled by a control unit 39 so as to lower a first block member 12 and to bring the first wafer W1 and the second wafer W2 into contact with each other. This allows first alignment marks provided on the first wafer W1 and second alignment marks provided on the second wafer W2 to be recognized in the same field of view of the cameras 47A. As a result, the first wafer W1 and the second wafer W2 can be aligned easily.

Next, as shown in FIG. 8, images of the first alignment marks provided on the first wafer W1 and the second alignment marks provided on the second wafer W2 are taken by image recognizing devices 47. Consequently, images of the first alignment marks on the first wafer W1, besides the second alignment marks on the second wafer W2, are taken through the second wafer W2. The taken images are transmitted as image data to the control unit 39. When the image data is transmitted to the control unit 39, the amount of misalignment between the first alignment marks provided on the first wafer W1 and the second alignment marks provided on the second wafer W2 is calculated from the image data by a CPU of the control unit 39. In accordance with the calculated amount of misalignment, the amount of correction for correcting the misalignment between the first alignment marks provided on the first wafer W1 and the second alignment marks provided on the second wafer W2 is calculated by the CPU of the control unit 39.

Subsequently, as shown in FIG. 9, the driving of the Z-axis driving mechanism is controlled by the control unit 39 so that the first block member 12 is moved in a direction in which the distance from a second block member 28 increases (upward). The distance between the first wafer W1 and the second wafer W2 is thereby increased.

Next, as shown in FIG. 9, an XY stage 52 and a rotating stage 54 are driven by the control unit 39 in accordance with the calculated amount of correction. Thereby, the second block member 28 is moved relative to the first block member 12 in the XY-direction or the θ-direction, and misalignment between the first alignment marks on the first wafer W1 and the second alignment marks on the second wafer W2 is corrected. Consequently, misalignment between the first alignment marks on the first wafer W1 and the second alignment marks on the second wafer W2 is removed.

Then, as shown in FIG. 10, the driving of the Z-axis driving mechanism is controlled by the control unit 39 so as to lower the first block member 12 and to bring the first wafer W1 and the second wafer W2 into contact with each other.

Next, as shown in FIG. 10, images of the first alignment marks provided on the first wafer W1 and the second alignment marks provided on the second wafer W2 are taken by the image recognizing devices 47, and it is confirmed whether the marks are misaligned. When the marks are misaligned, the amount of misalignment is calculated by the CPU of the control unit 39. After the amount of correction is calculated from the amount of misalignment, the first block member 12 is lifted again, and the second block member 28 is moved relative to the first block member 12 in the XY-direction or the θ-direction so as to remove the misalignment.

Then, the chamber 3 is evacuated.

Next, the first wafer W1 and the second wafer W2 aligned by the above-described aligning method are bonded by the above-described anode coupling method.

As described above, the Si wafer and the glass wafer can be precisely aligned and bonded by anode coupling.

Although particular embodiments have been described, many other variations and modifications and other uses will become apparent to those skilled in the art. Therefore, the present invention is not limited by the specific disclosure herein.

What is claimed is:

1. An aligning device comprising:
   a chamber;
   a flexible bellows connected to and extending from the chamber so as to define an airtight chamber therein with the chamber;
   a first block member disposed in the airtight chamber;
   a second member disposed in the airtight chamber;
   a driving unit disposed in the airtight chamber and configured to move one of the first block member and the second block member relative to the other, the first block member being configured to hold a first electronic component, and the second block member being configured to hold a second electronic component; and an image-taking port provided in the chamber and protruding inward from an outer surface of the chamber so as to define a space, the image-taking port including an observation window through which at least one of the first electronic component and the second electronic component is observed.

2. The aligning device according to claim 1, wherein an image-taking unit configured to take an image of at least one of the first electronic component and the second electronic component is provided in the space defined by the image-taking port.

3. The aligning device according to claim 2, wherein
the first electronic component includes a first alignment mark and the second electronic component includes a second alignment mark; and
the aligning device further comprises: a control unit connected to the driving unit and the image-taking unit and configured to calculate an amount of misalignment between images of the first alignment mark and the second alignment mark taken by the image-taking unit and to control the driving unit so as to correct the amount of misalignment.

4. The alignment device according to claim 3, wherein the control unit is configured to perform at least one of a translation and a rotation of the first block member and the second block member relative to each other.

5. The alignment device according to claim 1, wherein one of the first block member and the second block member is moved relative to the other by the driving unit in a direction such as to change a distance between the first electronic component held in the first block member and the second electronic component held in the second block member.

6. The aligning device according to claim 1, further comprising:
a rotating seal portion connected to the flexible bellows and configured to define the airtight chamber with the chamber and the flexible bellows and to allow the flexible bellows to corotate with the chamber.

7. The aligning device according to claim 1, wherein the chamber includes a cooling-water channel through which cooling water flows.

8. A bonding apparatus configured to bond electronic components, and comprising the aligning device according to claim 1.

9. The bonding apparatus according to claim 8, comprising:
a first pressure member provided in the airtight chamber and arranged so that a first space section is provided between the first pressure member and the first block member, and configured to press the first block member in a predetermined direction;
a plurality of rod-shaped first flexible members provided in the first space section, connected to an end face of the first block member such as to be equally spaced on a circumference concentric with a center of the first block member, and configured to transmit a pressure from the first pressure member to the first block member;
a second pressure member provided in the airtight chamber and arranged so that a second space section is provided between the second pressure member and the second block member, and configured to press the second block member in a direction in which the second block member presses the first block member;
a plurality of rod-shaped second flexible members provided in the second space section, connected to an end face of the second block member such as to be equally spaced on a circumference concentric with a center of the second block member, and configured to transmit a pressure from the second pressure member to the second block member; and
a heating member connected to the first block member and the second block member and configured to heat the first block member and the second block member.

10. The bonding apparatus according to claim 9, wherein at least one of the first block member and the second block member includes a through portion extending through the first block member or the second block member in a thickness direction.

11. The bonding apparatus according to claim 10, wherein an opening area of the through portion on one side in the thickness direction of the first block member or the second block member is larger than an opening area of the through portion on the other side in the thickness direction.

12. The bonding apparatus according to claim 9, wherein
the heating member is a heater chip;
the first block member includes a first presser plate configured to hold the first electronic component, a first back plate connected to the first presser plate and having a coefficient of linear expansion equal or substantially equal to a coefficient of linear expansion of the first presser plate, and the heater chip connected to the first back plate so as to heat the first presser plate and having a coefficient of linear expansion equal or substantially equal to a coefficient of linear expansion of the first presser plate; and
the second block member includes a second presser plate configured to hold the second electronic component, a second back plate connected to the second presser plate and having a coefficient of linear expansion equal or substantially equal to a coefficient of linear expansion of the second presser plate, and the heater chip connected to the second back plate so as to heat the second presser plate and having a coefficient of linear expansion equal or substantially equal to a coefficient of linear expansion of the second presser plate.

13. The bonding apparatus according to claim 12, wherein the first presser plate and the second presser plate are made of a conductive material, and the first back plate and the second back plate are made of an insulating material.

14. The bonding apparatus according to claim 12, wherein a first cooling-gas channel through which cooling gas flows is provided between the first presser plate and the first back plate, and a second cooling-gas channel through which cooling gas flows is provided between the second presser plate and the second back plate.

15. The bonding apparatus according to claim 14, wherein
the first flexible members include a cooling-gas supply function of passing the cooling gas therethrough and supplying the cooling gas to the first cooling-gas channel; and
the second flexible members have a cooling-gas supply function of passing the cooling gas therethrough and supplying the cooling gas to the second cooling-gas channel.

16. The bonding apparatus according to claim 12, further comprising:
a first drawing portion configured to draw the first electronic component onto the first presser plate; and
a second drawing portion configured to draw the second electronic component onto the second presser plate.

17. The bonding apparatus according to claim 16, wherein
the first drawing portion includes a plurality of drawing grooves provided in the first presser plate, and a first hollow duct for carrying air introduced from the first drawing groove; and
the second drawing portion includes a plurality of drawing grooves provided in the second presser plate, and a second hollow duct for carrying air introduced from the second drawing grooves.

18. The bonding apparatus according to claim 17, wherein the first hollow duct is connected to the first pressure member via a first elastic member, and the second hollow duct is connected to the second pressure member via a second elastic member.

19. The bonding apparatus according to claim 17, wherein
a first cooling-gas supply channel in which the cooling gas to be supplied to the first flexible members flows and a first air channel in which air from the first hollow duct flows are provided in the first pressure member; and
a second cooling-gas supply channel in which the cooling gas to be supplied to the second flexible members flows and a second air channel in which air from the second hollow duct flows are provided in the second pressure member.

20. The bonding apparatus according to claim 9, wherein
a first cooling-fluid circulation path in which cooling fluid for cooling the first pressure member circulates is provided in the first pressure member; and
a second cooling-fluid circulation path in which cooling fluid for cooling the second pressure member circulates is provided in the second pressure member.

* * * * *